United States Patent [19]

Sugimoto et al.

[11] Patent Number: 5,647,083
[45] Date of Patent: Jul. 15, 1997

[54] APPARATUS FOR CLEANING SUBSTRATES AND METHODS FOR ATTACHING/DETACHING AND CLEANING BRUSHES OF SUCH APPARATUS

[75] Inventors: Kenji Sugimoto; Nobuyasu Hiraoka; Mitsuhiro Fujita; Masami Ohtani, all of Kyoto, Japan

[73] Assignee: Dainippon Screen Mfg. Co., Ltd., Japan

[21] Appl. No.: 495,216

[22] Filed: Jun. 28, 1995

[30] Foreign Application Priority Data

Jun. 30, 1994 [JP] Japan ................................. 6-173298
Jul. 4, 1994 [JP] Japan ................................. 6-176084

[51] Int. Cl.⁶ ........................................................ A46B 13/02
[52] U.S. Cl. ............................. 15/77; 15/21.1; 15/88.2
[58] Field of Search ............................. 15/21.1, 77, 88.1, 15/88.2, 88.3, 88.4

[56] References Cited

U.S. PATENT DOCUMENTS

| 4,935,981 | 6/1990 | Ohtani | 15/88.2 |
| 5,375,291 | 12/1994 | Tateyama | 15/88.3 |
| 5,485,644 | 1/1996 | Shibara | 15/88.2 |

FOREIGN PATENT DOCUMENTS 0239953  10/1988  Japan ................................. 15/88.3

*Primary Examiner*—David Scherbel
*Assistant Examiner*—Randall Chin
*Attorney, Agent, or Firm*—Ostrolenk, Faber, Gerb & Soffen, LLP

[57] ABSTRACT

A plurality of brush support arms, each having a distal end unit brush attached thereto, stand by in juxtaposition in a standby position. The brush support arm having a desired brush attached thereto is selected from the plurality of brush support arms. Then, the selected brush support arm is connected at its proximal end to a distal end of a swing arm. The brush support arm engaged with the swing arm is swung with the swing arm about a pivotal point at a proximal end of the swing arm. As a result, the brush attached to the distal end of the selected brush support arm is moved between the standby position and the center of a substrate, to clean the substrate with this brush. Upon completion of this substrate cleaning, the brush support arm is returned to the standby position. A different brush support arm is selected in the standby position for use in a subsequent cleaning operation, and the substrate is cleaned with the brush connected to this different brush support arm.

12 Claims, 17 Drawing Sheets

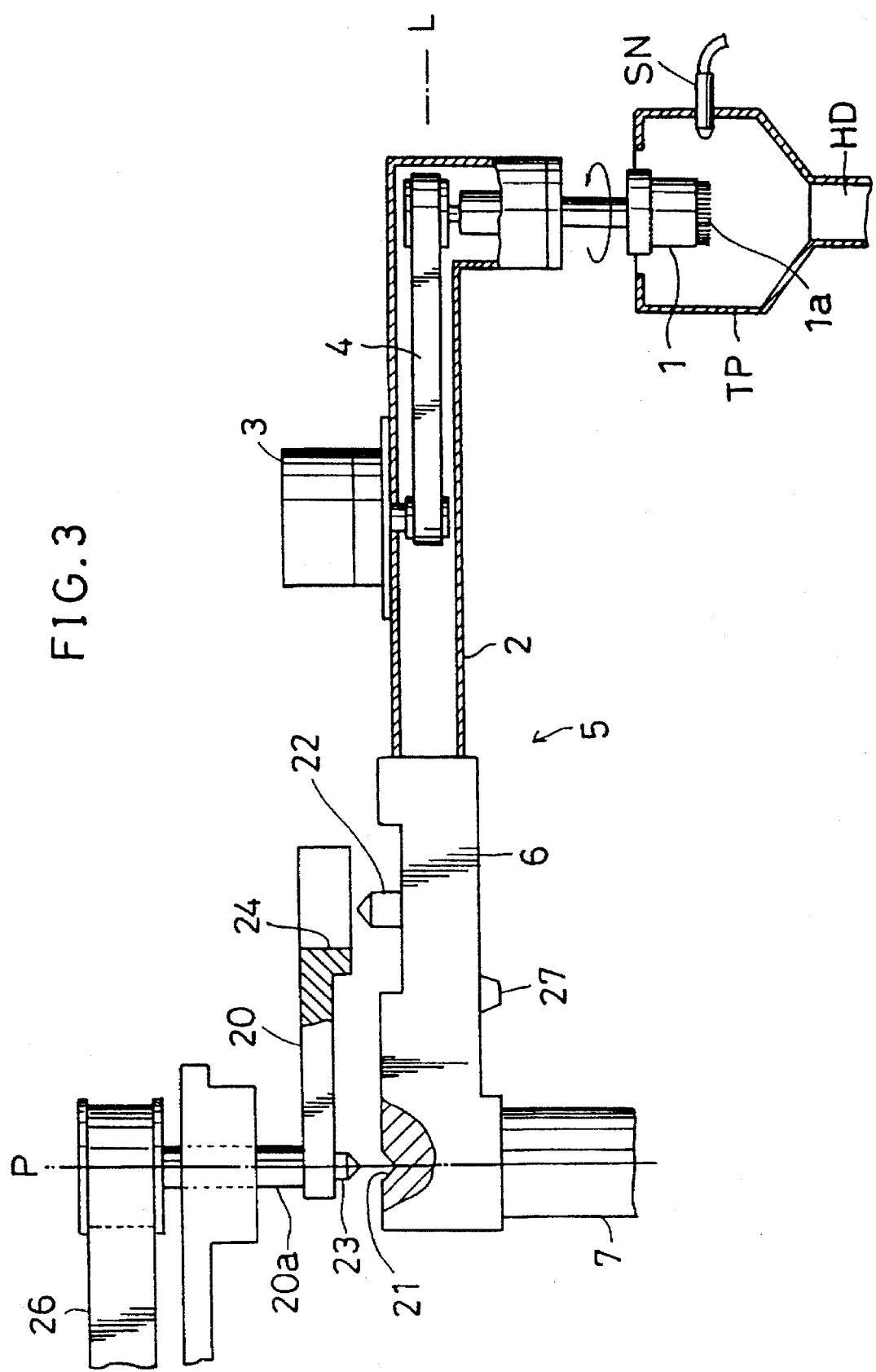

APPARATUS FOR CLEANING SUBSTRATES AND METHODS FOR ATTACHING/ DETACHING AND CLEANING BRUSHES OF SUCH APPARATUS

BACKGROUND OF THE INVENTION (1) Field of the Invention

The present invention relates to brush type cleaning apparatus and related methods, for cleaning surfaces of semiconductor wafers, glass substrates for liquid crystal displays, glass substrates for photomasks, substrates for optical disks and the like (hereinafter referred to simply as "substrates"). In particular, a surface of such a substrate is cleaned while the substrate is spinning, with the lower end of a brush touching or slightly spaced from the upper surface of the substrate surface. The invention relates also to methods of attaching and detaching the brushes to/from brush support arms.

(2) Description of the Related Art

A conventional cleaning apparatus of this type includes, for example, a brush attached to a distal end of a swing arm and standing by in a position outwardly of an outer edge of a substrate supported for. With swings of the swing arm, the brush is movable between the standby position and the center of a substrate surface. The brush is rotatable relative to a distal end of the swing arm.

According to this conventional apparatus, the substrate is cleaned as follows. First, the swing arm is swung forward to move the brush from the standby position to the center of the substrate surface. Then, the brush and the substrate are rotated, with the lower end of the brush touching or being slightly spaced from the substrate surface. In this state, the swing arm is swung backward to move the brush from the center toward the outer edge of the substrate surface, thereby cleaning the entire substrate surface with the brush. When the cleaning is completed, the swing arm is swung backward to return the brush to the standby position to be ready for a next substrate cleaning operation.

However, the above conventional apparatus has only one brush attached to the distal end of the swing arm and standing by in the standby position. This single brush is used to clean surfaces of substrates successively. Where, for example, different types of brushes are used for different cleaning purposes, substrates must be cleaned in the following sequence. First, a brush to be used for initial cleaning (e.g. a nylon brush) is attached to the distal end of the swing arm. A substrate is cleaned with this brush in an operation as noted above (rough cleaning). After this cleaning operation, the brush is returned to the standby position. Next, this brush is detached manually from the distal end of the swing arm, and a different type of brush (e.g. polyvinyl alcohol brush) is attached manually to the distal end of the swing arm. The substrate is cleaned with this different brush in a similar operation (finishing cleaning). That is, in this case, the brushes must be changed in the course of the substrate cleaning sequence, which imposes a great trouble upon the operator and results in a low throughput of the process.

Even where substrate surfaces are cleaned with the same type of brush, the conventional apparatus using one brush in consecutive operations wears down the lower end of the brush quickly. When the lower end of the brush is worn, the brush must be changed. In the prior art this brush changing operation is carried out manually and as a result is time-consuming and troublesome. In the conventional apparatus, as noted above, a single brush is used continually to wear down the lower end of the brush quickly and shorten a use period of the brush. Consequently, the troublesome brush changing operation must be carried out frequently.

Generally, the conventional apparatus of the prior art has the following mechanism for connecting a brush to the arm. The arm includes a bolt projecting from a coupling position thereof (where the cleaning brush is coupled). A nut is screwed to the bolt in a position at the upper end of the brush. Thus, the brush is detachably attached to the coupling position of the arm.

As described above, brushes are attached to and detached from the arm for changing the brushes to carry out different types of cleaning as, or when the life of a brush comes to an end with wear of the lower end thereof. To carry out attaching and detaching of a brush, the operator, by turning the nut of a brush attached to the arm, detaches the brush from the bolt in the coupling position of the arm. Then, the operator screws the nut of a new brush to the bolt to attached the new brush to the coupling position of the arm. In the conventional cleaning brush changing operation (i.e. attaching/detaching operation), abrasion takes place among the components since the bolt and nut are meshed together. The abrasion produces dust (particles) to recontaminate cleaned substrates.

The contamination of substrates is known to cause a low yield of products in a substrate treating process including this type of substrate cleaning. Thus, the contamination of substrate noted above can never be overlooked.

SUMMARY OF THE INVENTION

The present invention has been made having regard to the state of the art noted above, and its primary object is to provide a brush cleaning apparatus capable of automatically selecting a desired one of a plurality of brushes for use in cleaning substrate surfaces.

Another object of the present invention is to provide an improved brush cleaning method which uses a brush cleaning apparatus fulfilling the above primary object.

A further object of the present invention to provide a brush cleaning apparatus capable of suppressing the production of particles when a brush is attached to or detached from an arm, and a brush attaching/detaching method suited for use in this apparatus.

The above objects are fulfilled, according to the present invention, by a brush cleaning apparatus for cleaning a surface of a substrate with a brush while spinning the substrate. The apparatus comprises a plurality of brushes standing by in a standby position outside an outer edge of the substrate, and a moving device for selecting one of the brushes, and moving the selected brush between the standby position and the surface of the substrate.

This apparatus may further comprise a brush rotating device for rotating the selected brushes when the moving device moves from a central position of the surface toward the outer edge of the substrate.

The above apparatus carries out substrate cleaning as follows. First, the moving device selects one of the brushes maintained in the standby position. Next, the moving device moves the selected brush from the standby position to the center of a surface of a substrate. Then, the brush is rotated, with the lower end thereof touching or being slightly spaced from the substrate surface. While the substrate is spinning, the moving device moves the brush from the center toward the outer edge of the substrate, to clean this substrate. Upon completion of substrate cleaning with this brush, the moving device moves the brush to the standby position.

For cleaning a substrate by using different types of brushes, a plurality of brushes of different types are maintained in the standby position, and the moving device selects one type of brush after another. During the substrate cleaning operation using the different types of brushes, the operator need go to the trouble of changing the brushes manually, so that the cleaning process has improved throughput.

For cleaning a substrate with the same type of brushes, a plurality of brushes of one type are maintained in the standby position, and the moving device successively selects these brushes in cycles to effect substrate cleaning. Consequently, each brush has an extended life, so that brush changing operations need not be carried out frequently.

The above apparatus may further comprise a standby pot disposed in the standby position for receiving at least lower end portions of the brushes standing by, a standby brush rotating device for rotating the brushes standing by in the standby pot, and a cleaning liquid spraying device for spraying a cleaning liquid to the lower end portions of the brushes received in the standby pot to clean such lower end portions. The brushes in standby are rotated with the lower end portions thereof inserted into the standby pot, to have the lower end portions cleaned with the cleaning liquid sprayed thereto. The lower end portions of the brushes in standby are cleaned while a selected one of the brushes is being used in substrate cleaning.

Thus, substrates are cleaned with the brushes having clean lower end portions, to enhance substrate cleaning effects. With this apparatus, the same brush is not used continuously whether substrates are cleaned with different types of brushes or with the same type of brushes. Consequently, each brush has an extended standby time during which the lower end portion thereof is fully cleaned. Brushes with insufficiently cleaned lower end portions are never used for cleaning substrates.

The moving device may comprise a plurality of brush support arms standing by in juxtaposition in the standby position and having the brushes connected to distal ends thereof, respectively. A selected one of the brush support arms is swung about a fixed pivotal point to move the brush connected thereto between the standby position and the surface of the substrate (first embodiment). Alternatively, only the brushes may stand by in the standby position. In this case, one of the brushes is selected and connected to a distal end of a single swing arm. The swing arm is swung about a predetermined pivotal point to move the selected brush between the standby position and the surface of the substrate (second embodiment).

In the first embodiment noted above, each of the brush support arms may have a suction opening formed in the distal end thereof and communicating with a vacuum source, each brush being connected to the distal end of each of the brush support arms by vacuum suction. This construction facilitates attachment and detachment of each brush to/from the distal end of each brush support arm. In addition, this construction is unlikely to produce particles due to abrasion of the components.

Each brush attached by vacuum suction to the distal end of each brush support arm may be detached by decreasing the suction through the suction opening in the distal end of the brush support arm. Then, even if particles are produced by abrasion of the components, the particles are drawn through the suction opening. Thus, scattering of the particles is avoided to maintain the apparatus at a desired level of cleanliness and to protect the substrates from contamination (e.g. to avoid recontamination of cleaned substrates).

In the second embodiment noted above, as in the first embodiment, each brush may be connected to the distal end of the swing arm by vacuum suction, and may be detached by decreasing the suction through the suction opening in the distal end of the brush support arm. This construction produces the same effect as the first embodiment.

Each of the brushes may include a tapered attaching portion connected to the distal end of each of the brush support arms, and each of the brush support arms may include a tapered recess formed in the distal end thereof to fit with the attaching portion, and a suction opening formed in the recess. Then, each of the brushes is connected by vacuum suction to the distal end of each of the brush support arms, with the attaching portion fitted in the recess. With this construction, each brush may be attached in a predetermined condition to a predetermined position of the distal end of each arm, e.g. with the brush aligned to the distal end. This eliminates the inconvenience of the precision of substrate cleaning being variable with a change of brushes.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 3 is an enlarged side view, partly in section, of a principal portion of the first embodiment;

DESCRIPTION OF THE PREFERRED EMBODIMENTS

Preferred embodiments of the present invention will be described in detail hereinafter with reference to the drawings.

First Embodiment

An apparatus in the first embodiment will be described with reference to FIGS. 1 through 3 and FIGS. 4A through 4D.

Figure 2:
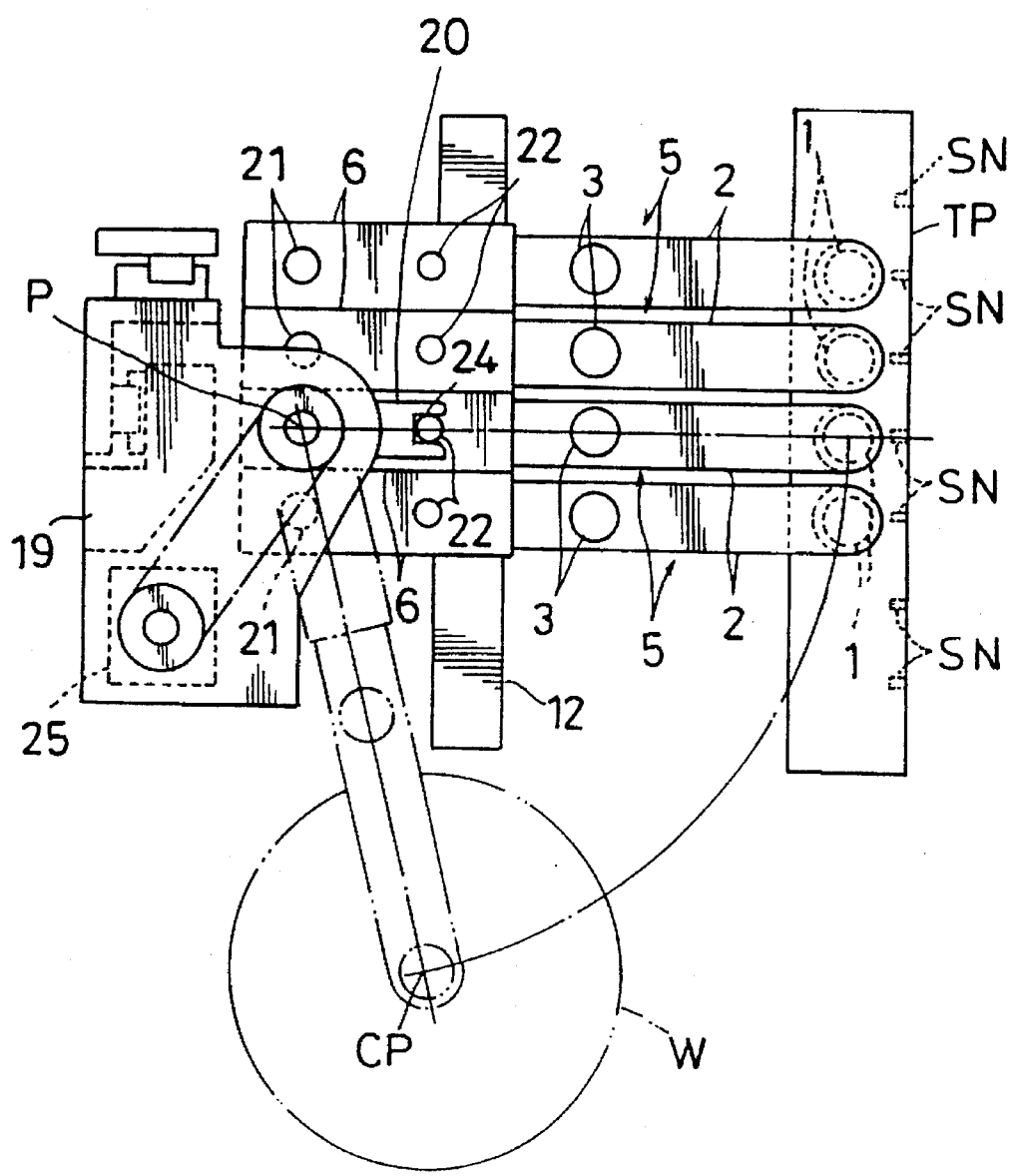
FIG. 2 is a plan view of the apparatus in the first embodiment.

This apparatus has is provided with a plurality of brushes 1, each rotatably attached to a distal end of a brush arm 2, a suitable substrate is the circular semiconductor spin (a circular substrate such as a semiconductor wafer being shown in FIG. 2). A moving device selects one of the brushes 1, and moves the selected brush 1 above the upper surface of substrate W at a location between spin center CP and a standby position outside an outer edge of the substrate W.

Figure 4A:
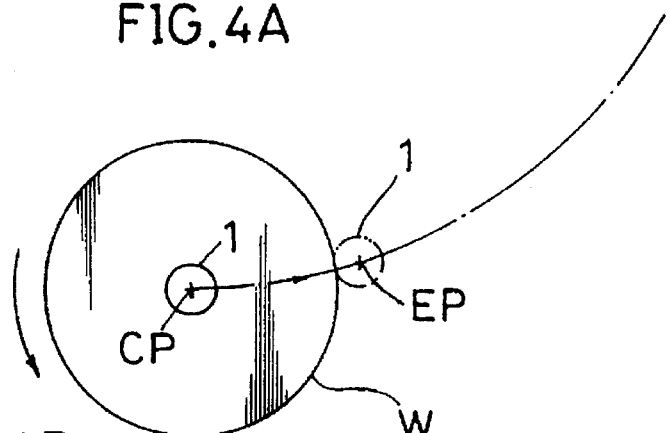
FIGS. 4A and 4B are a plan view, respectively and a side view showing a construction of a turntable for supporting a circular substrate and how a spinning substrate with a brush.
Figure 4B:
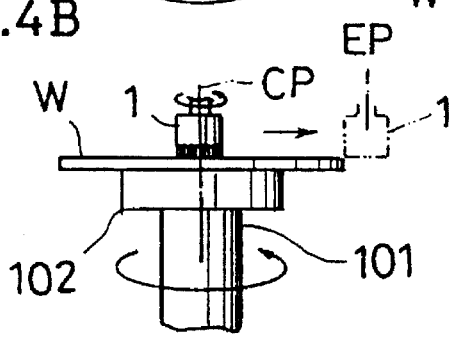
Figure 4C:
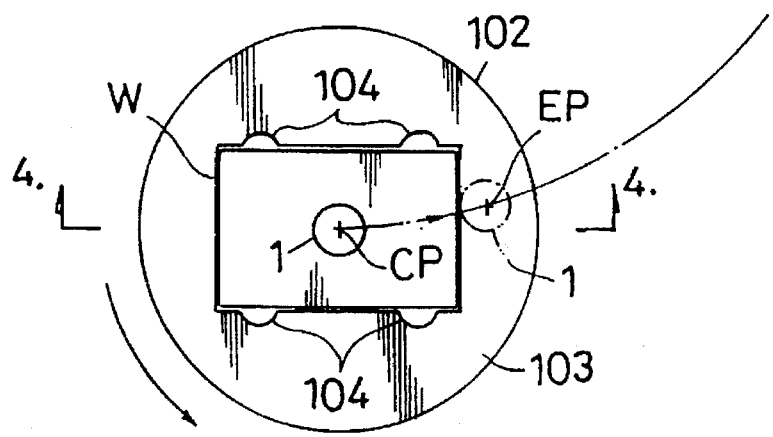
FIGS. 4C and 4D are a plan view and a section taken on line 4—4 of FIG. 4c, respectively showing a construction of a turntable for supporting a rectangular substrate and showing how a spinning substrate on the turntable is cleaned with a brush.
Figure 4D:
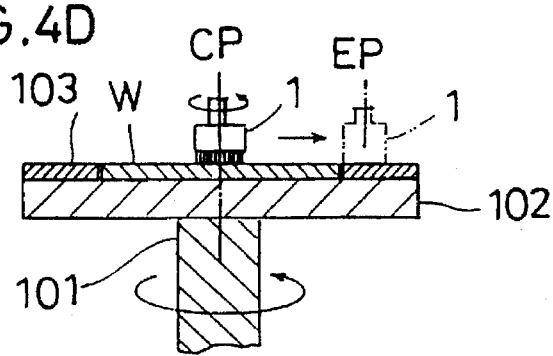

As shown in FIG. 4A through 4D, the substrate W is supported with an obverse surface turned upward, such as by suction, on a turntable 102 attached to a distal end of a rotary shaft 101 rotatable by a motor (not shown). The substrate W is spun about the spin center CP. When the substrate W is a rectangular substrate, such as a glass substrate for a liquid crystal display, as shown in FIGS. 4C and 4D, a substrate protective plate 103 (defining a recess corresponding to the shape of rectangular substrate W) is mounted on the turntable 102 to present a plane flush with the surface of substrate W. Reference numeral 104 in FIG. 4C denotes cutouts for receiving claws of a transport robot when the rectangular substrate W is placed in or removed from the recess of the substrate protective plate 103.

The brushes 1 in the standby position are placed at a lower level L and inside a standby pot TP. The standby pot TP includes a plurality of nozzles SN for spraying a cleaning liquid to lower end portions of brushes 1, that is, bristles 1a of brushes 1. Each brush 1 is attached to the distal end of brush arm 2 to be rotatable by an electric motor 3 mounted on the brush arm 2, rotation of the motor 3 being transmitted through a belt 4 (see FIG. 3). In the standby position, the brushes 1 are rotated in the standby pot TP, with the bristles 1a washed with the cleaning liquid sprayed from the nozzles SN. Reference HD denotes an exhaust drain for discharging the cleaning liquid after use.

Each brush arm 2 is rigidly connected at a proximal end thereof to a support block 6. The support block 6 is rigidly connected at the other end thereof to a rotary shaft 7. The brush arm 2 (including the electric motor 3), support block 6 and rotary shaft 7 constitute a brush support arm 5.

In this embodiment, a selected one of the brush support arms 5 is swung about a pivotal point P, described hereinafter, to move between the standby position and the spin center CP of substrate W. Thus, one of the brushes 1 is selected for use in cleaning the substrate W. A moving mechanism for selectively swinging the brush support arms 5 corresponds to the moving device of the present invention. A construction of this moving mechanism will be described hereinafter.

The rotary shaft 7 of each brush support arm 5 is rotatably supported by an arm support 8. The arm supports 8 are juxtaposed in a row on a common movable frame 9 to be vertically movable independently of one another through guide rails 10.

The movable frame 9 is supported by a fixed apparatus frame 11 to be movable horizontally along a guide rail 12. The movable frame 9 has a rack 13 engaged with a pinion 15 driven by a reversible electric motor 14. Thus, with opposite rotations of the electric motor 14, the arm supports 8 are movable in directions of juxtaposition.

A lift frame 17 is disposed alongside the arm supports 8 to be vertically movable by two air cylinders 16a and 16b connected in series. The lift frame 17 includes a movable bracket 19 which is vertically movable by an air cylinder 18. The movable bracket 19 has a support shaft 20a attached to an upper position thereof to be rotatable about the pivotal point P fixed to a predetermined position. A drive arm 20 is attached to a lower portion of the support shaft 20a to be pivotable about the pivotal point P.

The support block 6 of each brush support arm 5 has a conical engaging recess 21 formed in an upper surface thereof and on the axis of the rotary shaft 7. Further, an engaging pin 22 projects from a position on the upper surface of the support block 6 spaced from the recess 21 toward the brush 1.

The drive arm 20 has a conical engaging projection 23 formed on a lower surface thereof and aligned with the pivotal point P, and an engaging bore 24 spaced from the pivotal point P to receive the engaging pin 22. A selected one of the brush support arms 5 is moved by the movable frame 9, electric motor 14 and the like to a position in which the axis of the rotary shaft 7 of the selected brush support arm 5 is located right under the pivotal point P of the drive arm 20. Then, the drive arm 20 is lowered to the brush support arm 5. The drive arm 20 and brush support arm 5 are rigidly interconnected, with the engaging recess 21 and engaging pin 22 of the brush support arm 5 engaged with the engaging projection 23 and engaging bore 24 of the drive arm 20, respectively. These engaging elements act also as an aligning mechanism for positioning the axis of rotary shaft 7 against a horizontal displacement from the pivotal point P of the drive arm 20.

The support shaft 20a of drive arm 20 is interlocked to a reversible electric motor 25 mounted on the movable bracket 19, through a timing belt 26. With opposite rotations of the electric motor 25, the selected brush support arm 5 engaged with the drive arm 20 swings about the fixed pivotal point P. As a result, the brush 1 attached to this brush support arm 5 moves between the standby position outside the outer edge of substrate W and the spin center CP of substrate W.

Each support block 6 has a positioning projection 27 formed on a lower surface thereof. On the other hand, the movable frame 9 has a positioning recess 28 formed in an upper surface thereof. Each brush support arm 5, when standing by at the lower level L, is maintained in a fixed position by engagement between the positioning projection 27 and positioning recess 28.

Next, an operation of this embodiment will be described with reference to FIGS. 1 through 6.

Figure 1:
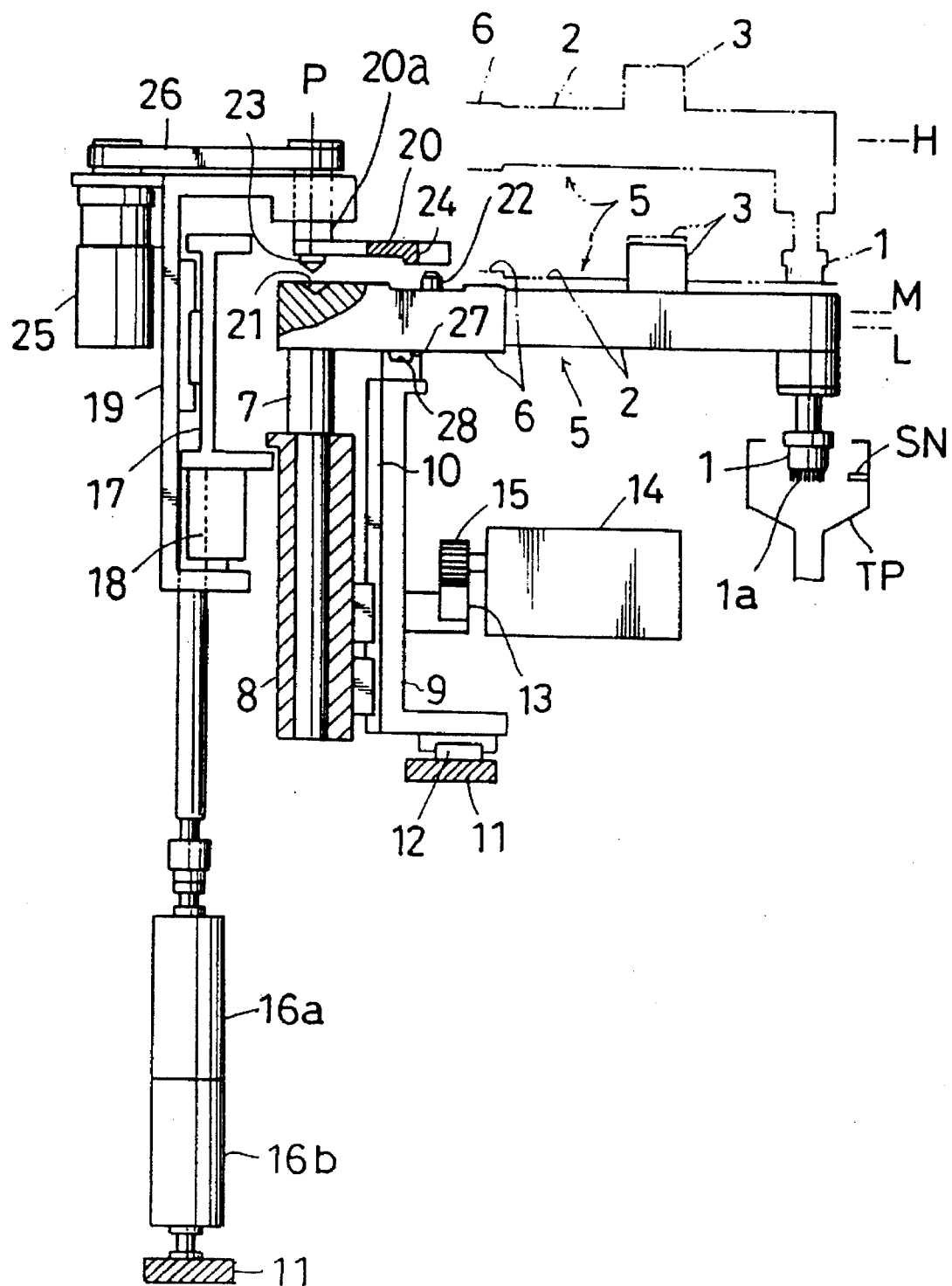
FIG. 1 is a side view, partly in section, showing an outline of a brush cleaning apparatus constructed according to a first embodiment of the present invention.

(1) Initially, all of the brushes 1 are in the standby position outside the outer edge of substrate W, with the arm supports 8 standing by in lower positions, as shown in solid lines in FIGS. 1 and 2. Each brush support arm 5 at the lower level L is maintained in the fixed position by the engagement between the positioning projection 27 and positioning recess 28.

In this standby state, each brush 1 is rotated in the fixed standby pot TP by the electric motor 3, to have the bristles 1a cleaned with the cleaning liquid.

Here, the cleaning liquid is sprayed directly toward the lower end portions of the brushes 1 from the nozzles SN respectively in this embodiment. However, the cleaning liquid may be sprayed toward the upper or middle portions of the brushes 1 from the nozzles SN respectively. Such cleaning liquid may be supplied to the lower end portions of the brushes 1, by being transferred through the bristles 1a with because of the weight of such.

(2) To start a substrate cleaning operation, the electric motor 14 moves the movable frame 9 horizontally to bring the brush support arm 5 having a selected brush 1 to the position right under the pivotal point P or drive arm 20.

Figure 5:
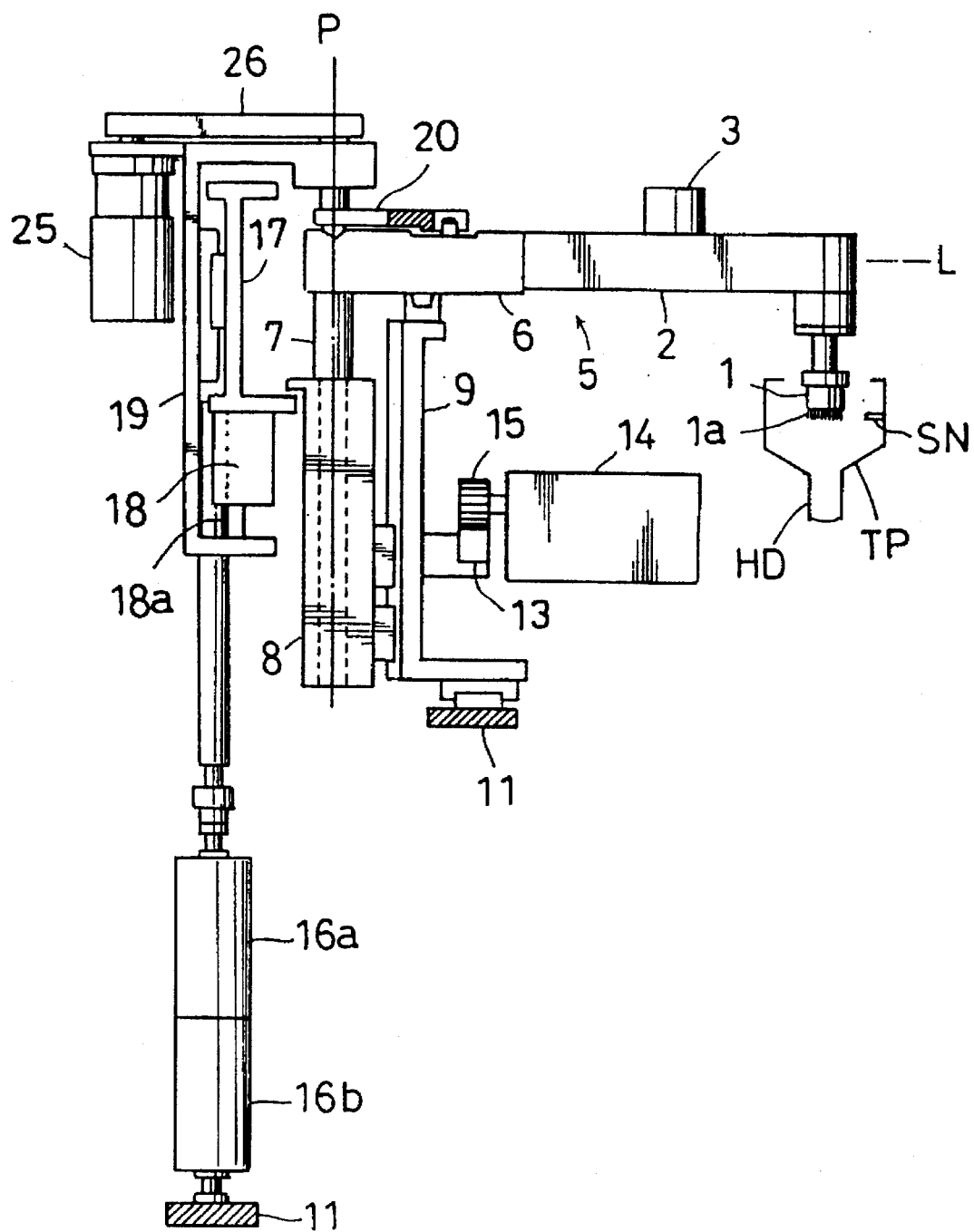
FIGS. 5 and 6 are explanatory side views, partly in section, showing different operational positions of the first embodiment.

(3) Next, a rod 18a of air cylinder 18 is extended as shown in FIG. 5, to lower the movable bracket 19. With a resultant descent of drive arm 20, the selected brush support arm 5 is engaged with the drive arm 20. Consequently, the rotary shaft 7 is aligned with the pivotal point P of drive arm 20, so that the brush support arm 5 may be swung or pivoted about the rotary shaft 7 as a canter to place the selected brush 1 at the pivot center CP of substrate W. The electric motor 3 of the brush support arm 5 carrying the selected brush 1 is stopped to stop rotation of the brush 1.

Figure 6:
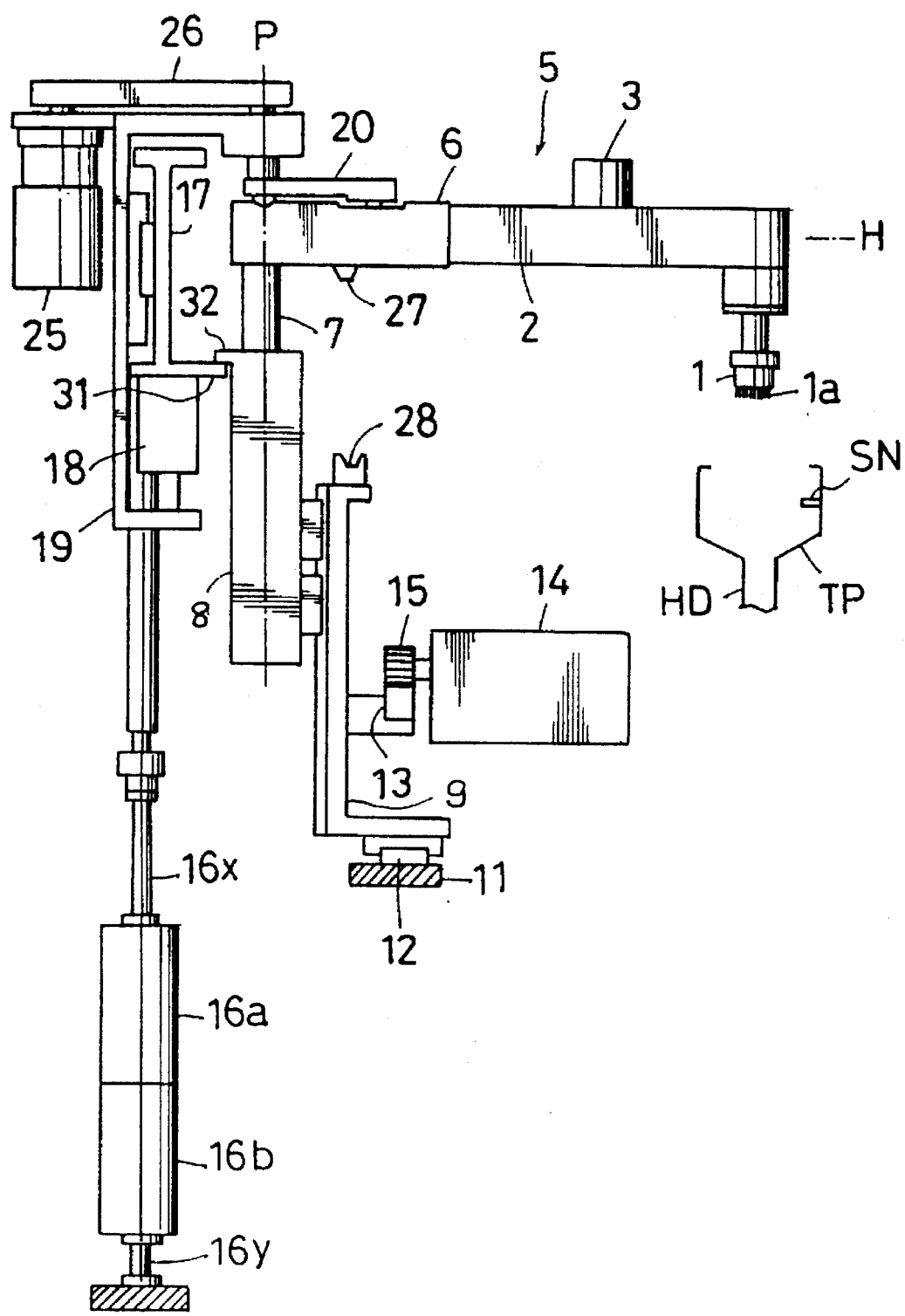

(4) Subsequently, as shown in FIG. 6, rods 16x and 16y of air cylinder 16a and 16b are both extended to raise the lift frame 17. At an early stage of the ascent, a contact portion 31 formed on the lift frame 17 engages the lower surface of projection 32 at the upper end of the contacts, from below, an upper end projection 32 of the arm support 8. Consequently, the selected brush support arm 5 is vertically clamped between the drive arm 20 and the contact portion 31 of lift frame 17. The lift frame 17 is raised further in the clamping state. Then, as shown in FIG. 6, only this selected brush support arm 5 is raised with the arm support 8 to an upper level H.

(5) Next, the electric motor 25 is rotated forward to swing the drive arm 21 by a predetermined angle in the clockwise direction in FIG. 2. As a result, the selected brush 1 is moved to a position over the spin center CP of substrate W supported on the turntable 102.

(6) Next, the rods 16x and 16y of air cylinders 16a and 16b are contracted to lower the brush 1 so that the lower ends of the bristles 1a thereof touch the surface of substrate W. When the substrate W is cleaned with the lower ends of the bristles 1a of brush 1 slightly spaced from the surface of substrate W, the brush 1 may be lowered to a level M in FIG. 1 (which is slightly higher than the lower level L) by contracting only the rod 16x of air cylinder 16a which, in this embodiment, has the greater stroke of the two rods 16x and 16y.

(7) In this state, the substrate W is spun about the spin center CP, and the electric motor 3 is driven to rotate the brush 1.

(8) The electric motor 25 is rotated backward while supplying a cleaning liquid to the surface of substrate W from a nozzle not shown. As shown in FIGS. 4A through 4D, the brush 1 is moved from the spin center CP to a position EP laterally of the outer edge of substrate W, thereby cleaning the entire surface of substrate W. When cleaning a rectangular substrate W, the brush 1 approaching the position EP once moves outward from a short side of substrate W and then mount the surface of substrate W again. In this embodiment, the substrate protective plate 103 is provided as shown in FIGS. 4C and 4D, to render the surface of substrate W flush with surrounding areas. This construction effectively avoids wear of the bristles 1a of brush 1 due to collisions with the edges of substrate W occurring when the brush 1 mounts the surface of substrate W from the sideways direction. This construction is also effective to prevent the cleaning effect from being reduced by dust (particles) generated by the collisions between the bristles 1a of brush 1 and the edges of substrate W. The end position of brush movement in the cleaning operation is not limited to the position EP which is completely outside the surface of substrate W as shown in FIGS. 4A through 4D, but may be a position where part (e.g. a half) of the brush 1 remains on the surface of substrate W.

(9) When the substrate W has been cleaned with this brush 1, rotation of brush 1 is stopped. The contracted rods of air cylinders 16a and 16b (only the air cylinder 16a, if the brush 1 has been lowered to position M) are extended to retract the brush 1 and brush support arm 5 by lifting them to the upper level H. Subsequently, the electric motor 25 is rotated backward to swing the brush support arm 5 back to the standby position. With the brush support arm 5 placed in the standby position, the rods 16x and 16y of air cylinders 16a and 16b are both contracted to lower the lift frame 17 to a lower limit position. Next, the rod 18a of air cylinder 18 is contracted (retracted) to raise the movable bracket 19 and drive arm 20, thereby disengaging the drive arm 20 and brush support arm 5. Then, the brush 1 is rotated again. The brush 1 used in the substrate cleaning is inserted into the standby pot TP, and the rotating bristles 1a of brush 1 are washed with the cleaning liquid. The brushes 1 other than the selected brush 1 (brush support arm 5) have been left standing by in the standby pot TP. The bristles 1a of these brushes 1 are continuously washed with the cleaning liquid during the substrate cleaning operation with the selected brush 1. When a different one of the brushes 1 is selected after the above substrate cleaning operation, the movable frame 9 is driven appropriately to select a brush support arm 5 to be connected to the drive arm 20, and the above operation is repeated.

Where different types of brushes 1 are used, such as nylon brushes 1 having nylon bristles 1a and PVA brushes 1 having sponge 1a made of PVA, for cleaning substrates, the different types of brushes 1 are attached to the distal ends of brush arms 2 of brush support arms 5 beforehand, and are maintained in the standby position, so that the different types of brushes 1 may be selected successively for use. Where, for example, a nylon brush 1 is used for rough cleaning and a PVA brush 1 for finishing cleaning thereafter, the brush support arm 5 having the nylon brush 1 is selected first to carry out rough cleaning with this brush 1, and then the brush support arm 5 having the PVA brush 1 is selected to carry out finishing cleaning with this brush 1. There is no need for a brush changing operation during the series of substrate cleaning steps using the above brushes 1.

Where a cleaning operation is carried out using only the same type of brushes 1 (e.g. nylon brushes), these brushes 1 are attached to the distal ends of brush arms 2 of brush support arms 5 beforehand, and are maintained in the standby position, so that the brushes 1 may be used successively in cycles. Then, the bristles 1a of brushes 1 will wear well to prolong the life of brushes 1.

By successively using a plurality of brushes 1 for substrate cleaning, each brush 1 has an extended time (standby time) after being used in the substrate cleaning till its next turn of use. The bristles 1a of each brush 1 may be cleaned fully during this period, thereby to prolong the life of brush 1. A good substrate cleaning effect is maintained since the bristles 1a of brushes 1 are not used without being fully cleaned. The conventional apparatus would require the brush 1 to remain in the standby position for a fixed time. It is therefore impossible to clean substrates W in a continuous process with the bristles 1a of brush 1 fully cleaned, resulting in a reduced throughput of the process. This embodiment is free from such an inconvenience.

Where the substrate W is cleaned only with the lower ends of the bristles 1a of brush 1 touching its surface, the apparatus may be adapted to cause the lower ends of the bristles 1a of brush 1 to touch the surface of substrate W at level M. This modification and the next modification are applicable also to the second and third embodiments described hereinafter.

Figure 7:
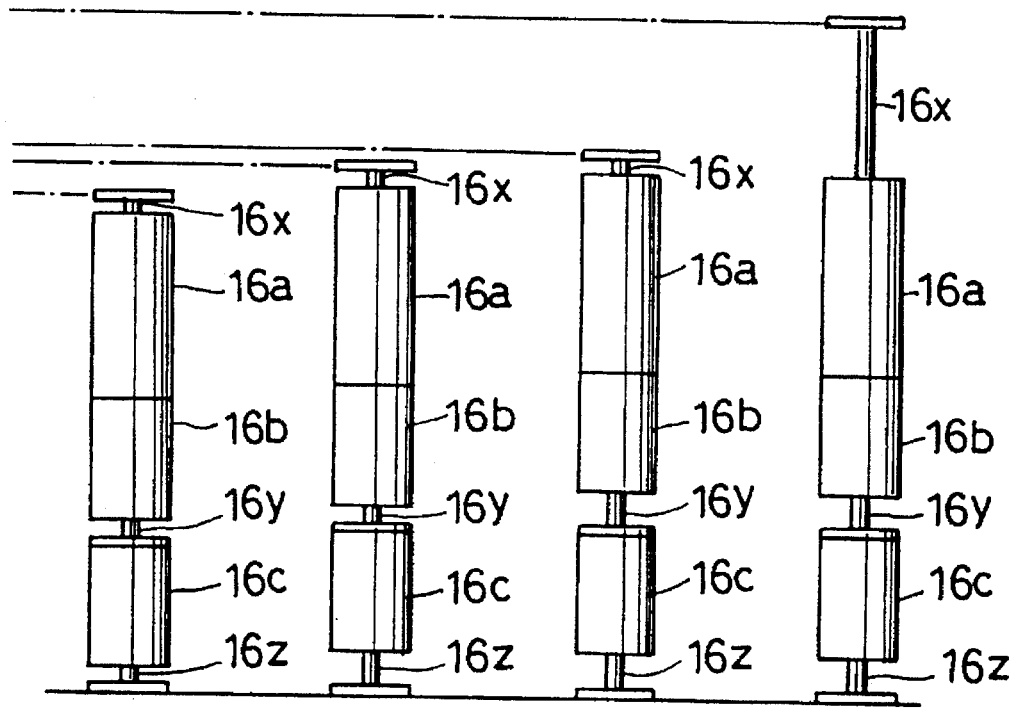
FIG. 7 is a side elevation showing a principal portion of a modification relating to brush height adjustment in the first embodiment.

In the above embodiment, the brushes 1 are movable among the three levels of height, including the lower level L for the lower ends of the bristles 1a of brushes 1 to touch the surface of substrate W and to stand by in the standby position. However, different levels may be provided for the contact of the lower ends of the bristles 1a of brush 1 with the surface of substrate W and for the standby position of brush 1, so that the brush 1 is movable among four levels of height (i.e. level L for the standby, a level for the lower ends of the bristles 1a of brush 1 to touch the surface of substrate W, a level for the lower ends of the bristles 1a of brush 1 to be slightly spaced from the surface of substrate W, and level H for swinging the brush 1). In this case, as shown in FIG. 7, an additional air cylinder 16c is connected in series with the air cylinders 16a and 16c, to provide the four levels by combinations of extension and contraction of rods 16x, 16y and 16z of air cylinders 16a, 16b and 16c.

The above embodiment is illustrated to include four brushes 1 (brush support arms 5) in the standby position. However, the number of brushes 1 is not limited to four, but may be any plural number.

Second Embodiment

The second embodiment of the present invention will be described next with reference to FIG. 8.

Figure 8:
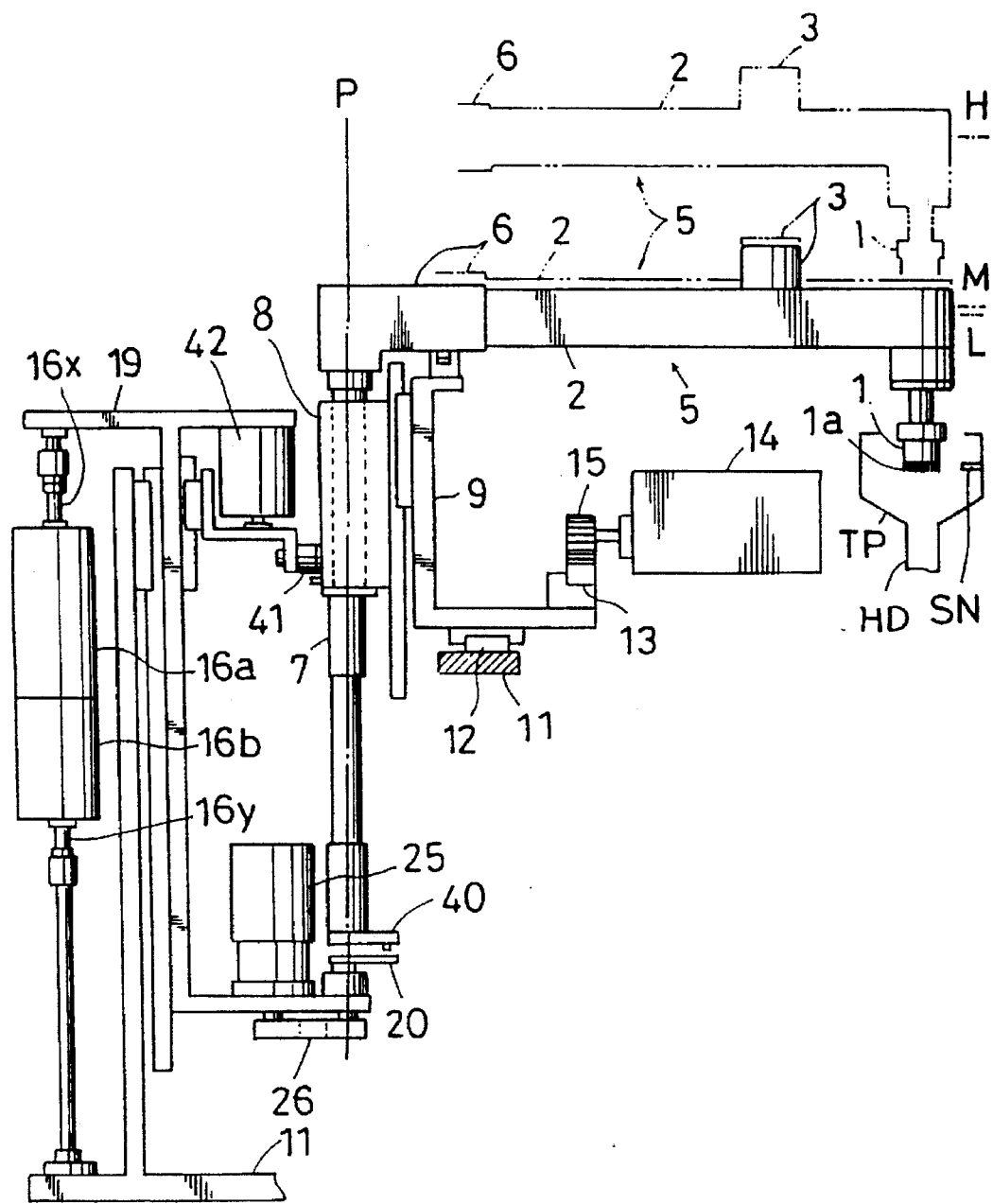
FIG. 8 is a side view of apparatus constructed according to a second embodiment of the invention.

FIG. 8 is a side view of an apparatus constructed according to the second embodiment. Which differs from the first embodiment in the following aspect.

The rotary shaft 7 of each brush support arm 5 has a connecting arm 40 attached to a lower end thereof for aligned engagement with a drive arm 20. The drive arm 20 clamps the rotary shaft 7 against a contact 41 that is independently and vertically movable by an air cylinder 42 mounted on the lift frame 19. Otherwise, this embodiment is the same as the first embodiment, and like reference numerals are used to identify like parts, in the first and second embodiments so that the will not be described again even though they may be oriented differently in the respective embodiments.

Third Embodiment

Figure 9:
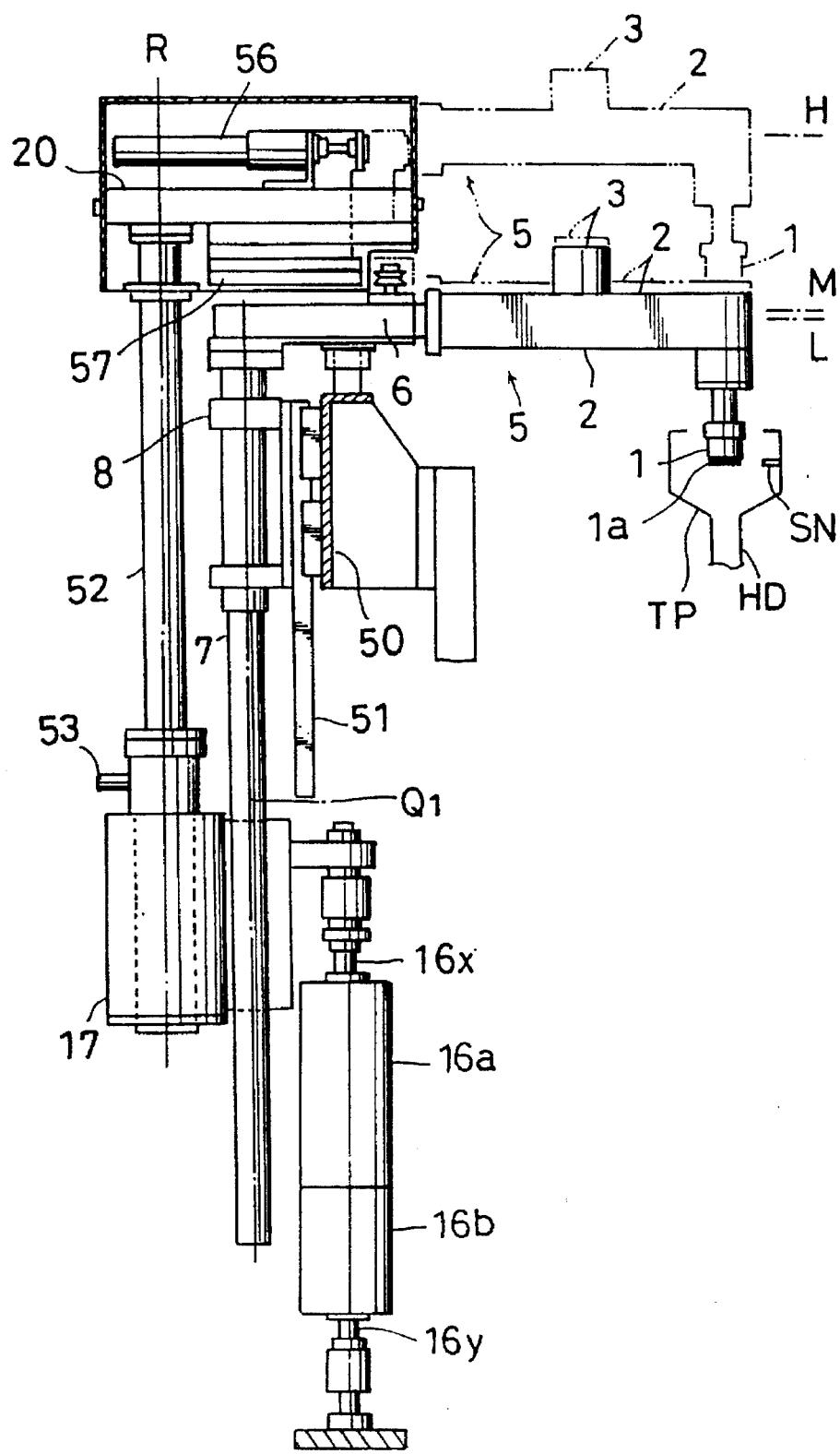
FIG. 9 is a side view of apparatus constructed according to a third embodiment of the invention.
Figure 10:
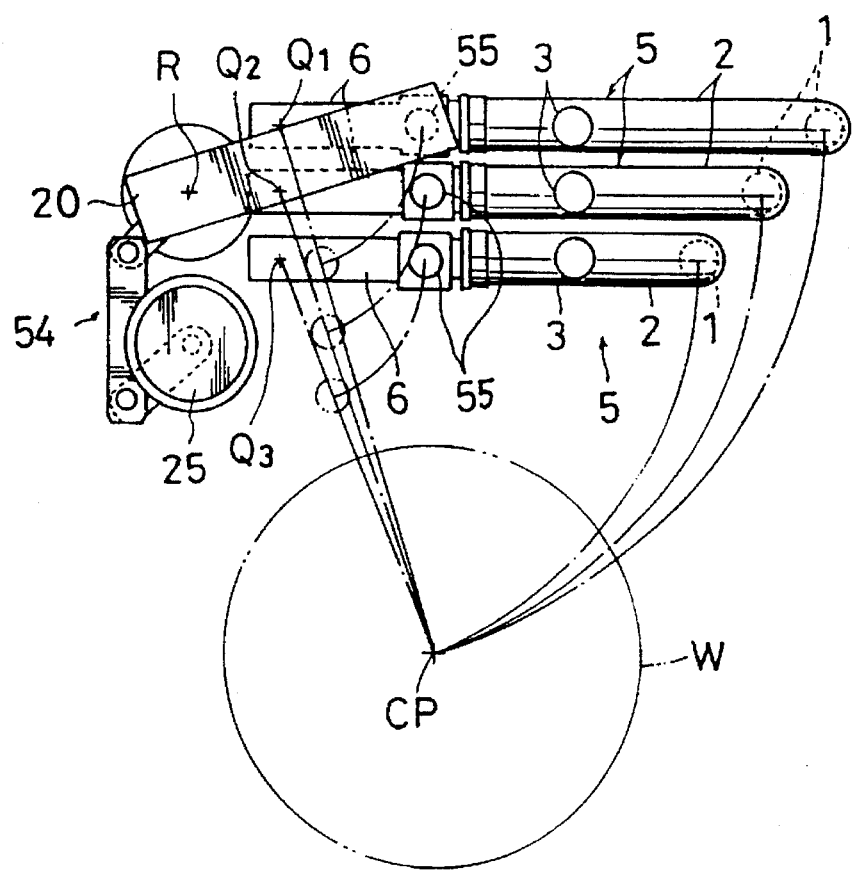
FIG. 10 is a plan view of the third embodiment.
Figure 11:
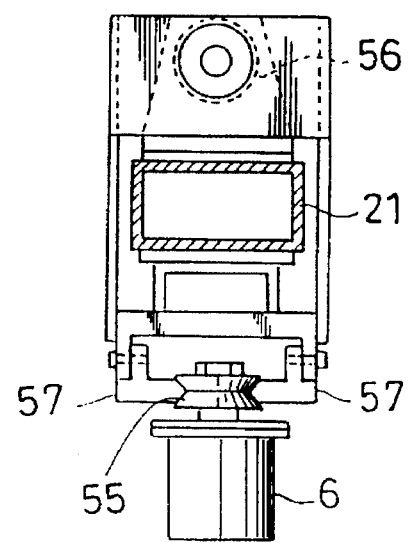
FIG. 11 is a fragmentary side elevation partially sectioned of a principal portion of the third embodiment.

The third embodiment will be described next with reference to FIGS. 9 through 11. It is noted that standby pot TP is omitted from FIG. 10.

The third embodiment differs from the first embodiment in the following aspects.

A plurality of brush support arms 5 supporting brushes 1 are juxtaposed to be pivotable about different fixed pivotal points Q1, Q2 and Q3, respectively. Each brush support arm 5 is rigidly connected at a proximal end thereof to a rotary shaft 7 rotatably supported by an arm support 8. The arm support 8 is supported by an apparatus frame 50 to be vertically movable along a guide rail 51. A drive arm 20 is disposed alongside these brush support arms 5 to be pivotable about a fixed pivotal point R to select a brush 1 to be used.

The drive arm 20 is connected at a proximal end thereof to a support shaft 52 supported, rotatably about the pivotal point R, by a lift frame 17 which is vertically movable by two air cylinders 16a and 16b connected in series. The support shaft 52 has an arm 53 extending therefrom and interlocked through a link mechanism 54 to an electric motor 25 mounted on the lift frame 17. With opposite rotations of the motor 25, the drive arm 20 is pivotable over and across the group of brush support arms 5.

Each brush support arm 5 has a V-grooved roller 55 mounted in an upper position adjacent the proximal end thereof to be rotatable about a vertical axis. The drive arm 20 has a pair of right and left guide rails 57 arranged in a lower position thereof to be extendible and retractable longitudinally of the drive arm 20 by an air cylinder 56. When extended forward, the guide rails 57 engage the roller 55. This embodiment is the same as the first embodiment in the other aspects, and like reference numerals are used to identify like parts, which will not be described again.

The third embodiment operates as follows.

(1) The drive arm 20 pivots over the brush support arms 5 standing by at the lower level L, and selects a brush support arm 5 having a brush 1 to be used. The guide rails 57 are extended forward to engage the roller 55 of the selected brush support arm 5.

(2) Both of the air cylinders 16a and 16b are extended to raise the lift frame 17, thereby moving the selected brush support arm 5 to the upper level H.

(3) Next, the drive arm 20 is swung to move the brush support arm 5 to a position over the pivot center CP of substrate W. In this case, a difference in pivotal point between the brush support arm 5 and drive arm 20 is absorbed by a relative movement between guide rails 57 and roller 55.

(4) Subsequently, the rods of both air cylinders 16a and 16b (or the rod of one of the air cylinders 16a ) are contracted to lower the brush support arm 5 by a predetermined amount. The substrate W is cleaned with the lower ends of the bristles 1a of brush 1 touching (or slightly spaced from) the surface of substrate W.

Fourth Embodiment

The fourth embodiment of this invention will be described next with reference to FIGS. 12 through 15.

In the first to third embodiments described hereinbefore, one of the plurality of brush support arms 5 carrying the brushes 1 is selected to move a desired brush 1 between the spin center CP of substrate W and the standby position. In the fourth embodiment, only a plurality of brushes 1 are placed in the standby position, and a single swing arm is used to move a selected one of the brushes 1 between the spin center CP of substrate W and the standby position.

Specifically, a swing arm 61 is driven to swing about a pivotal axis S disposed laterally of a substrate W that is supported for a spin (rotation) as in the construction shown in FIGS. 4A through 4D. This swing arm 61 picks up a selected brush 1 from among a plurality of brushes 1 that are standing by in a standby pot TP provided in a standby position, and moves this brush 1 between the standby position and the spin center CP of substrate W.

The following mechanism in this embodiment for vertically moving and horizontally swinging the swing arm 61 corresponds to the moving device of the present invention.

In particular, swing arm 61 is attached at a proximal end thereof to a distal end of an arm support shaft 62 having an axis aligned to the pivotal point S. The arm support shaft 62 is rotatably and vertically movably with respect to a base frame 63 on which shaft 67 is mounted. The arm support shaft 62 receives, in a proximal position thereof, a torque from an electric motor 65 transmitted through a belt 64, to swing the swing arm 61 about the pivotal point S.

Under the arm support shaft 62 is an air cylinder 66 having a rod 66a with a hoist element 67 attached to a distal end thereof. When extended, the rod 66a of air cylinder 66 pushes up the arm support shaft 62 at the lower end thereof, to raise the swing arm 61. A stopper 68 is attached to the arm support shaft 62 for contacting a support block 69 to limit descent of the arm support shaft 62. Further, the arm support shaft 62 is extendible and contractible by extension and contraction of a rod 70a of an air cylinder 70.

Brush chuck 71 extends downward from the distal end of swing arm 61 to be rotatable by an electric motor 73 through a belt 72. Thus, a brush 1 is rotatable when supported by the Brush chuck 71 as described hereinafter.

The brush chuck 71 includes four claws 74 attached to a distal end thereof to be openable and closable in crosswise directions. The brush chuck 71 supports a brush 1 with the clamping claws 74 entering a circumferential groove 1b, formed in an upper portion of brush 1, from four different directions as shown in FIG. 14B.

These claws 74 are pivotable about pivotal points 75. Each claw 74 has a disk-shaped element 76 attached to a distal end thereof and resting on a support plate 78 constantly biased upward by a compression coil spring 77. Thus, the claws 74 are constantly biased toward closed positions. A drive shaft 81 having a depressing element 79 attached to a lower end thereof is disposed above the disk-shaped elements 76. The drive shaft 81 is mounted in the brush chuck 71 to be vertically movable through bearings 80 slidable only vertically inside the chuck 71. The drive shaft 81 is vertically movable by expansion and contraction of a rod 82a of an air cylinder 82. When the rod 82a of air cylinder 82 is extended, the drive shaft 81 is lowered to depress the support plate 78 and open the claws 74 through the disk-shaped elements 76.

Figure 13:
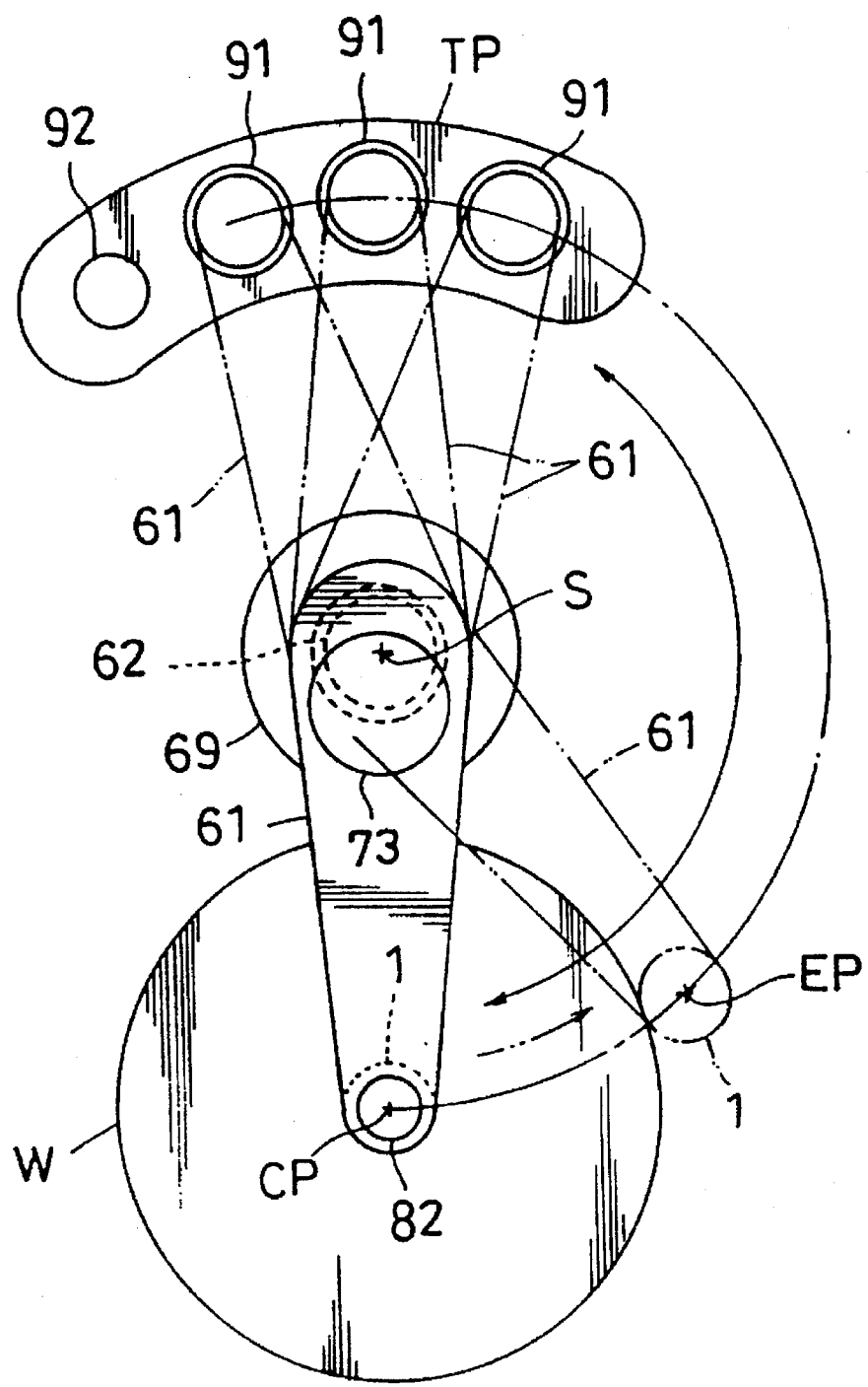
FIG. 13 is a plan view of the fourth embodiment.
Figure 14:
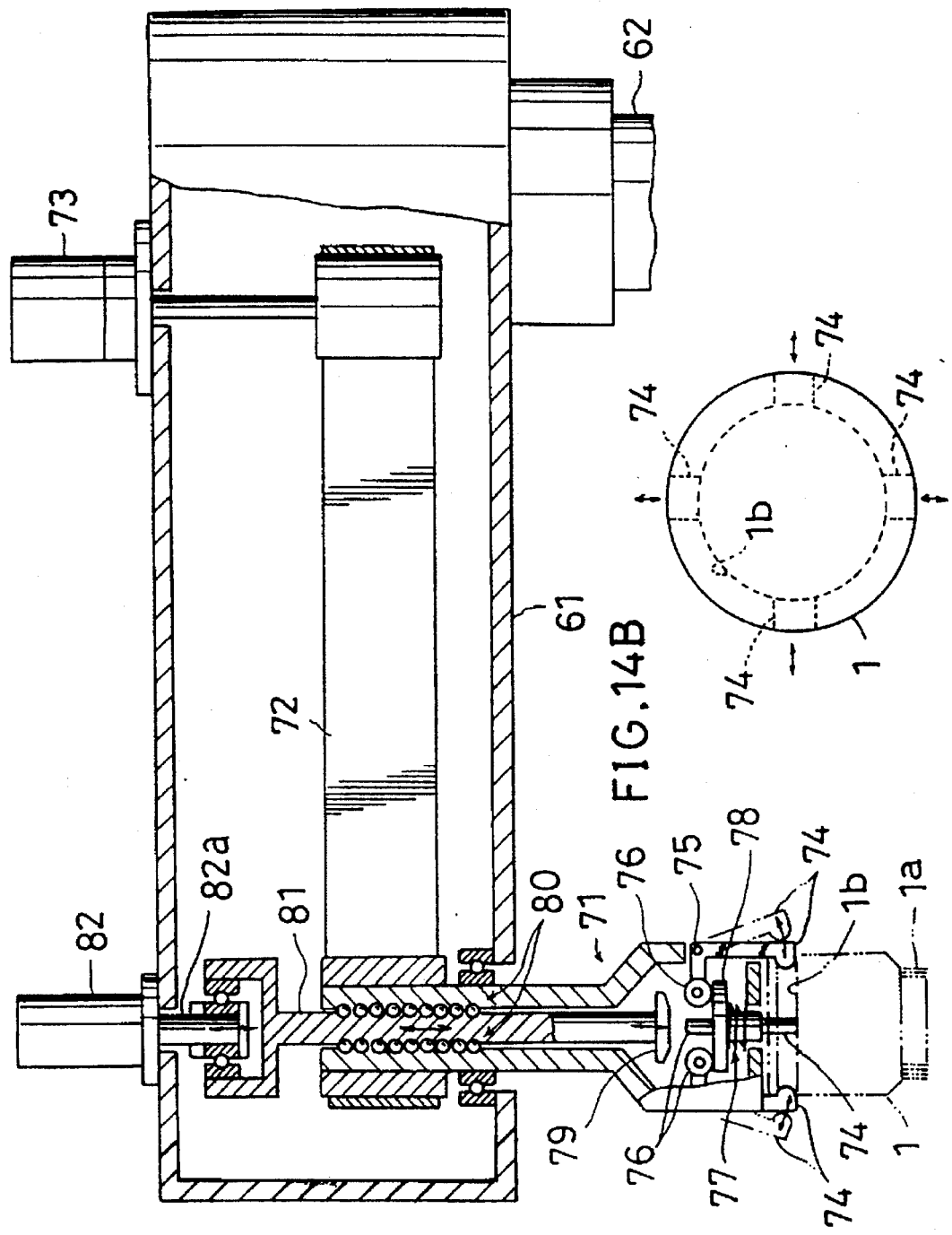
FIG. 14A is a side view, partly in section, of a swing arm in the fourth embodiment.
FIG. 14B is a plan view of the brush of FIG. 14A and clamping claws engaged with this brush.
Figure 15:
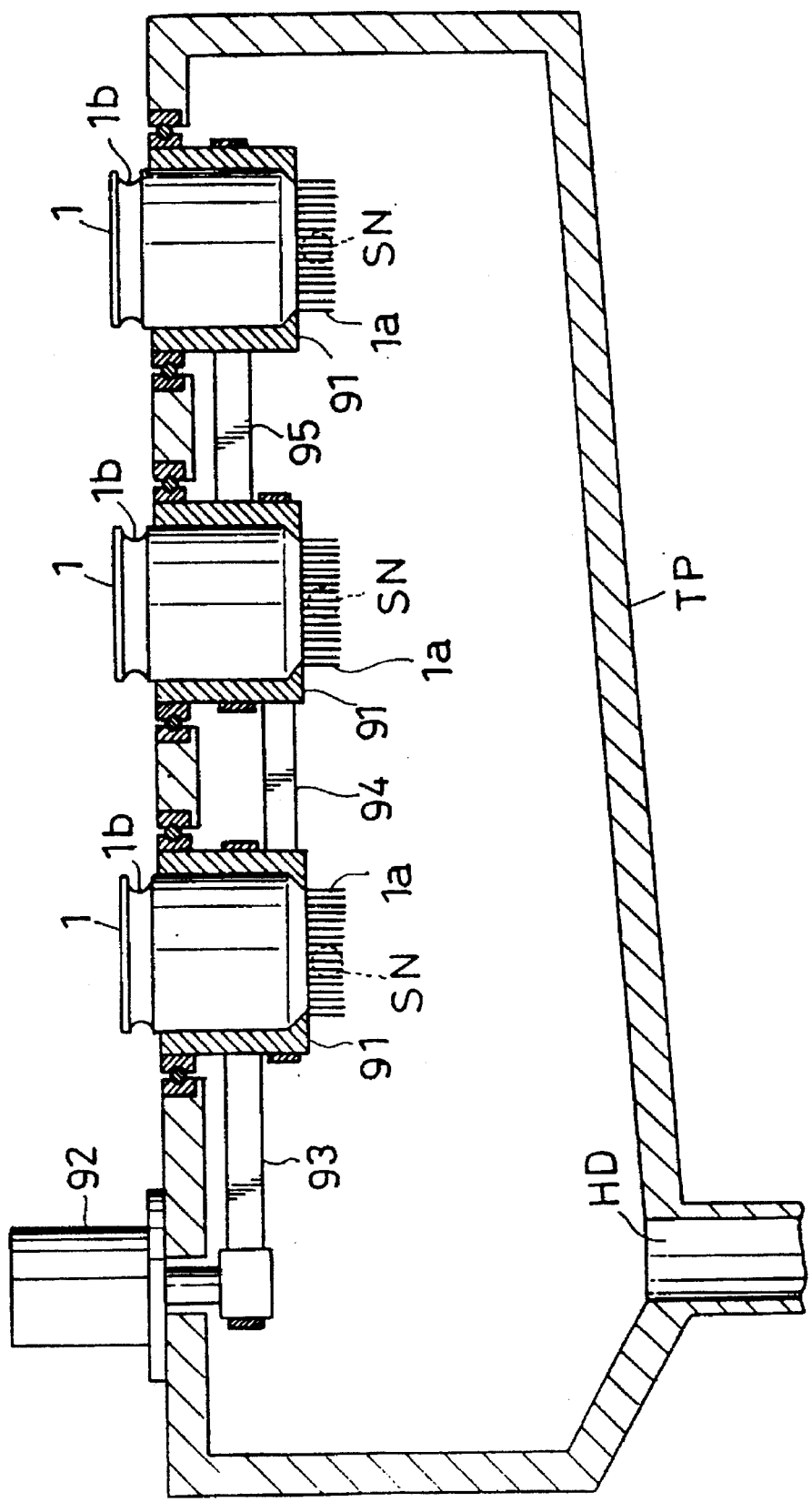
FIG. 15 is an enlarged sectional side view of a standby pot in the fourth embodiment.

With particular reference to FIGS. 13 and 15 it is seen that standby pot TP includes a plurality of standby cups 91 arranged along a swinging track of the brush chuck 71 attached to the swing arm 61. Each standby cup 91 removably receives a brush 1 with the groove 1b exposed upward and the bristles 1a projecting downward. The standby cups 91 are arranged in the standby pot TP to be rotatable by an electric motor 92 through belts 93, 94 and 95. The standby pot TP further includes a plurality of nozzles SN for spraying a cleaning liquid. The brushes 1 standing by in the respective standby cups 91 are rotated to have the bristles 1a cleaned. Reference HD in FIG. 15 denotes an exhaust drain for discharging the cleaning liquid after use.

Next, an operation of this fourth embodiment will be described with particular reference to FIGS. 12 and 13.

Figure 12:
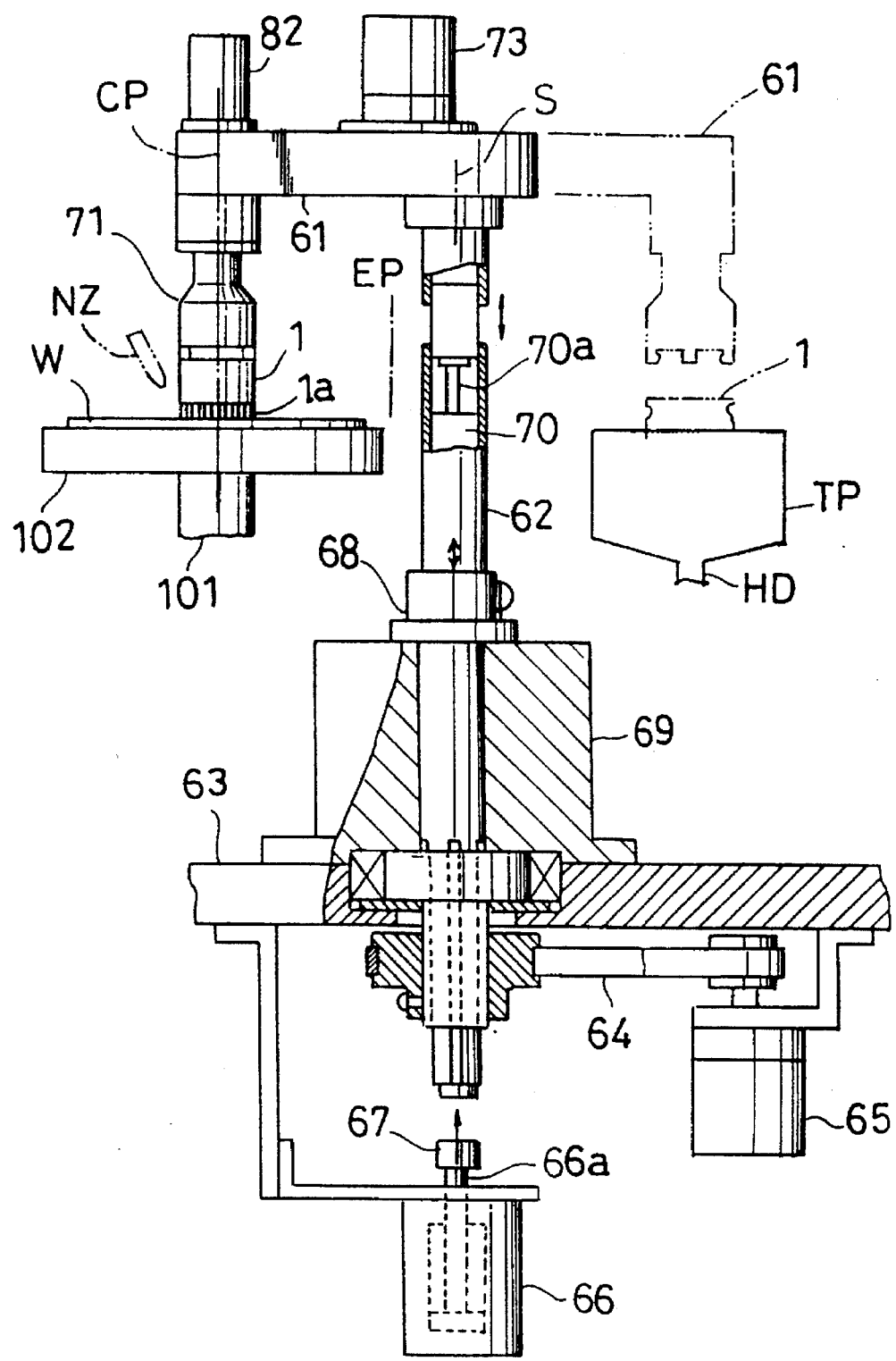
FIG. 12 is a side view, partly in section, of apparatus constructed according to a fourth embodiment of the invention.

(1) Initially, the swing arm 61 stands by above the standby pot TP as shown in a two-dot-and-dash line in FIG. 12. At this time, the stopper 68 of arm support shaft 62 is in contact with the support block 69. The arm support shaft 62 is extended by extension of the rod 70a of air cylinder 70. Each brush 1 is placed in the standby cup 91 of standby pot TP. In this standby state, each brush 1 is rotated by the electric motor 92 to have the bristles 1a cleaned with the cleaning liquid being emitted from nozzles SN.

(2) To start a substrate cleaning operation, the electric motor 65 is driven to swing the swing arm 61, so that the brush chuck 71 of swing arm 61 is located over a selected one of the brushes 1 disposed in the standby cups 91 of standby pot TP. Then, the electric motor 92 is stopped to stop rotation of cups 91 and brushes 1 held thereby. The rod 82a of air cylinder 82 is extended to open the claws 74 of brush chuck 71. Further, the rod 70a of air cylinder 70 is contracted to contract the arm support shaft 62 and lower the brush chuck 71. Next, the rod 82a of air cylinder 82 is contracted (raised) to close the claws 74 of brush chuck 71 to grip the selected brush 1. The rod 70a of air cylinder 70 is extended to pick up the selected brush 1 from the standby cup 91. After the selected brush 1 is withdrawn upward, the electric motor 92 is driven again to resume cleaning of the bristles 1a of brushes 1 that remain standing by in the standby pots TP.

(3) Next, the rod 66a of air cylinder 66 is extended to raise the arm support shaft 62. In this state, the electric motor 65 is rotated forward to swing the swing arm 61, moving the fetched brush 1 to the position over the spin center CP of substrate W.

Figure 16:
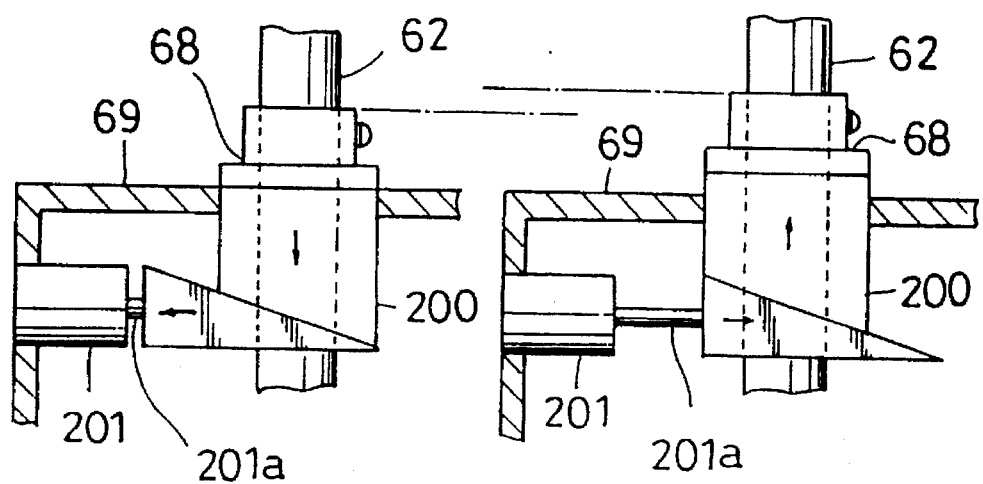
FIG. 16 is a view showing a principal portion of a modification relating to brush height adjustment in the fourth embodiment.

(4) Next, the rod 66a of air cylinder 66 is contracted to lower the brush 1. At this time, the stopper 68 is in contact with the support block 69 to maintain the brush 1 at a predetermined level for the substrate cleaning to follow. The stopper 68, support block 69 and other components are adjusted so that, when the stopper 68 contacts the support block 69, the lower ends of the bristles 1a of brush 1 touch the surface of substrate W (or the lower ends of the bristles 1a of brush 1 are slightly spaced from the surface of substrate W). Where cleaning is carried out selectively with the lower ends of the bristles 1a of brush 1 touching the surface of substrate W and with the lower ends of the bristles 1a slightly spaced therefrom, the air cylinder 70 may be replaced with two air cylinders connected in series to extend and contract the arm support shaft 62 in two stages, for example. As shown in FIG. 16, the support block 69 may include a contact 200 vertically movable by expansion and contraction of a rod 201a of an air cylinder 201. Then, the brush 1 has varied levels provided by contact between the stopper 68 and contact 200.

(5) With the level of brush 1 adjusted, the substrate W is spun about the spin center CP, and the electric motor 73 is driven to rotate the brush 1.

(6) The electric motor 65 is rotated backward while supplying a cleaning liquid to the surface of substrate W from a nozzle NZ (FIG. 12). As shown in FIG. 13, the brush 1 is moved from the spin center CP to a position EP laterally of the outer edge of substrate W, thereby cleaning the entire surface of substrate W.

(7) When the substrate W has been cleaned, the motor 73 is stopped to stop rotation of brush 1. The rod 66a of air cylinder 66 is extended to raise the arm support shaft 62. In this state, the electric motor 65 is rotated backward to swing the swing arm 61 to move the used brush 1 to a position over the now empty standby cup 91 from which this brush 1 has been taken, and electric motor 92 of standby pot TP is stopped. Next, the rod 66a of air cylinder 66 is contracted, and the rod 70a of air cylinder 70 is contracted to contract the arm support shaft 62, lowering the brush 1 back into the empty standby cup 91. Then, the rod 82a of air cylinder 82 is extended to open the claws 74 of brush chuck 71 to release the brush 1. The rod 70a of air cylinder 70 is extended to raise the brush chuck 71 and close the claws 74 to stand by until the next cleaning operation. When the used brush 1 is placed in the standby cup 91, the electric motor 92 is driven to resume cleaning of the bristles 1a of brushes 1. The above operation is repeated when a different brush 1 is used.

According to this embodiment, only the brushes 1 stand by in the standby pots 91. In a brush changing operation, the operator is relieved from a troublesome operation of detaching the brushes 1 from the arms or the like. This advantage of reducing the burden on the operator is provided in addition to the effects described in relation to the first embodiment.

In the fourth embodiment, the substrate W and standby pot TP are opposed to each other across the pivotal point S for swing arm 61. For example, the standby pot TP may be disposed sideways from the substrate W. As in the first embodiment, the substrate W and standby position may be arranged such that the swing arm 1 swings approximately 90 degrees in moving a brush 1 between the standby position and the spin center CP of substrate W. The first to third embodiments may be modified, as in the fourth embodiment, to arrange the substrate W and standby pot TP opposed to each other across the pivotal point P (FIGS. 1 and 2), or to have the standby pot TP disposed sideways from the substrate W.

In the fourth embodiment, the gripping action of claws 74 of brush chuck 71 is used to connect one of the brushes 1 standing by in the standby pots TP to the swing arm 6. Alternatively, the connection (attachment/detachment) between the brush 1 and swing arm 61 may be effected by vacuum suction as described hereinafter, with particular referents, to FIGS. 17 through 19. The components omitted from these figures, and those labeled with like references in FIGS. 12 through 15, are the same as in the fourth embodiment, and will not be described again.

Each brush 1 in this modification has a tapered end the location where bristles 1a are planted. This tapered end acts as an attaching portion 1c to be connected to a coupling 110 at a distal end of a swing arm 61, which coupling 110 defines a tapered recess 111 for fitting with the attaching portion 1c of brush 1. A suction opening 112 is formed in the recess 111. The coupling 110 is formed integral with a distal end of a rotary shaft 113 supported by the swing arm 61 to be rotatable about an axis B.

The suction opening 112 communicates with a vacuum source 117 through axial passage 114 in the rotary shaft 113, a pipe 115 connected to the swing arm 61 to communicate with the passage 114, and a switch valve 116. The switch valve 116 is operable to establish and cancel a vacuum suction through the suction opening 112. A pipe 118 branched from the pipe 115 communicates with the ambient through a switch valve 119 and a needle valve 120. The switch valve 119 is operable to decrease the vacuum suction through the suction opening 112. The needle valve 120 is operable to adjust the decrease in the vacuum suction.

The rotary shaft 113 receives a torque from a motor 73 through a belt 72. With rotation of the motor, the brush 1 supported in the coupling 110 is rotatable about the axis B.

Figure 18:
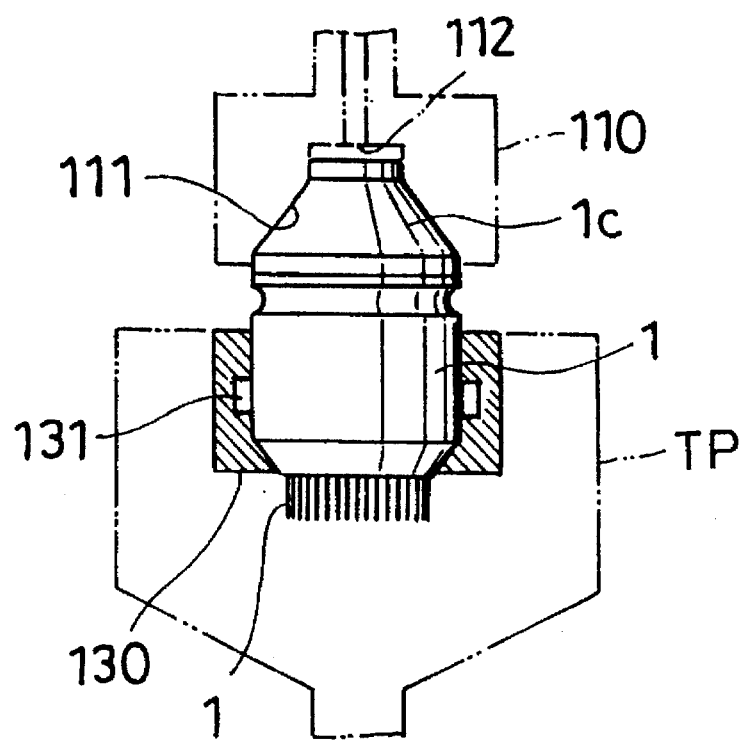
FIG. 18 is a sectional view of a standby cup seen from a side of a standby pot in the modification of FIG. 17.
Figure 19:
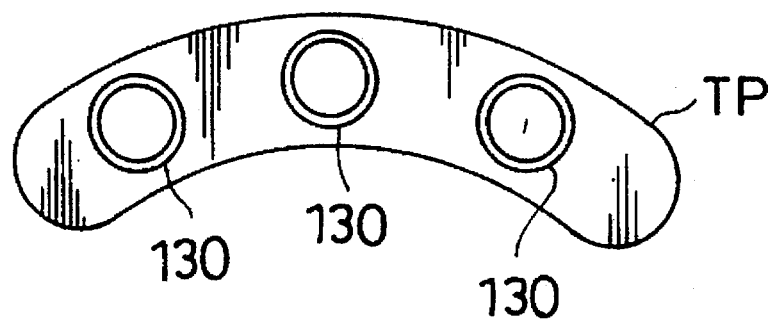
FIG. 19 is a plan view of standby pots in the modification of FIG. 17.

As shown in FIG. 18, a standby pot TP includes standby cups 130 each including suction openings 131 formed in inner walls thereof and communicating with a vacuum source not shown. Each standby cup 130 is switchable between suction state and non-suction state by a switching device not shown. This switching device may, for example, comprise a switch valve for communicating the suction openings 131 selectively with the vacuum source and with the ambient.

This modification is operable as follows to attach and detach a brush 1 to/from the swing arm 61, i.e. to connect one of the brushes standing by in the standby pots TP to the swing arm 61, and to disconnect the brush 1 from the swing arm 61 when delivering the brush 1 to stand by in the standby pot TP after a substrate cleaning operation.

For connecting one of the brushes 1 to the swing arm 61, the swing arm 61 is lowered to the brush 1 in standby, causing the tapered attaching portion 1c of brush 1 to enter the tapered recess 111 in the coupling 110 of swing arm 61. Next, the switch valve 116 is opened and the switch valve 119 closed to establish a state of decompression by the vacuum source. As a result, the brush 1 is sucked to the coupling 110 of swing arm 61. Then, the swing arm 61 is raised to draw the suction-supported brush 1 from the standby pot TP (standby cup 130). At this time, the suction of brush 1 by the standby cup 130 is canceled to present no obstruction to the pullout of brush 1.

When disconnecting the brush 1 from the swing arm 61, the swing arm 61 is lowered from a position over the standby pot TP to insert the brush 1 connected (by suction) to the swing arm 61 into a predetermined standby cup 130. The suction openings 131 in the standby cup 130 are switched to the suction state to retain the brush 1 in place. Then, the switch valve 116 is closed to cancel the suction through the suction opening 112, or the switch valve 116 is left open and the switch valve 119 is opened to decrease the suction (this decrease being adjusted by the needle valve 120) through the suction opening 112. The swing arm 61 is raised to remove the attaching portion 1c of brush 1 from the recess 111 in the coupling 110 of swing arm 61. At this time, the brush 1 is retained in the standby cup 130 by suction, instead of being raised by the swing arm 61. When the brush 1 is disconnected from the swing arm 61, the suction of brush 1 by the standby cup 130 is canceled.

In this modification, as described above, the brush 1 is attachable and detachable without being abraded with other components, thereby producing little or no particles to contaminate substrates W. When disconnecting the brush 1 from the swing arm 61, the switch valve 119 may be opened with the switch valve 116 left open, to decrease the vacuum suction through the suction opening 112. Then, even if particles are produced by an abrasion occurring when the brush 1 is disconnected, the particles are drawn through the suction opening 112 since the suction therethrough is maintained. This avoids scattering of the particles to ensure protection of substrate W from contamination.

In this modification, the attaching portion 1c of brush 1 is tapered, and the coupling 110 of swing arm 61 defines the tapered recess 111 to fit with the attaching portion 1c. The suction opening 112 is formed in the recess 111 so that, when the attaching portion 1c is fitted in the recess 111, the brush 1 is suction-supported in the coupling 110. Consequently, the brush 1 may be attached precisely in a predetermined condition to a predetermined position of coupling 110, e.g. with the axis of brush 1 aligned to the axis of rotation B. This construction effectively avoids such inconveniences as damage to the apparatus and a reduction in the cleaning effect which could occur if, for example, the brush 1 is attached with the axis thereof displaced from the axis of rotation B, or the brush 1 becomes offset when the rotary shaft 113 is rotated about the axis of rotation B during a cleaning operation.

In this modification, the attaching portion 1c of brush 1 is tapered, and the coupling 110 of swing arm 61 defines the recess 111 having the suction opening 112. However, the constructions of attaching portion 1c and coupling 110 and the position of suction opening 112 are not limited to the above modification. These components may be formed as shown in FIGS. 20A through 20I, for example.

Figures 20A, 20B, 20C:
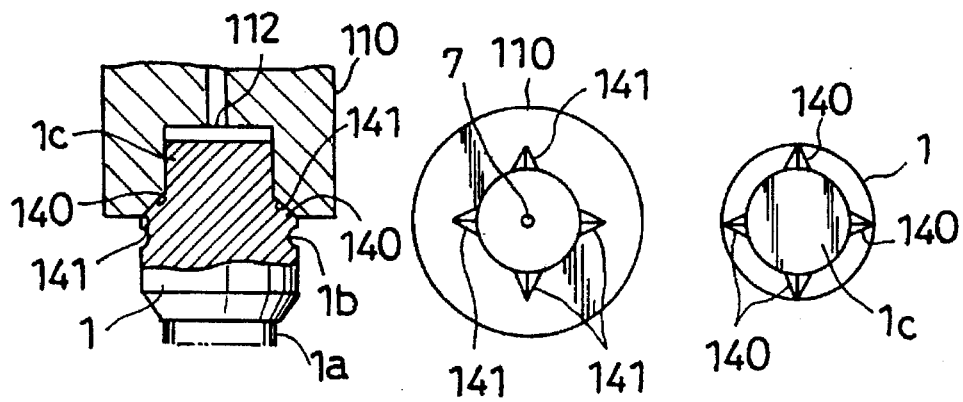
FIGS. 20A through 20I are views showing other modifications relating to the connection between an arm and a brush.

In the construction shown in FIGS. 20A through 20C, the attaching portion 1c has a cylindrical shape, and defines one or more (four in the drawings) pyramid-shaped projections 140. The coupling 110 defines a cylindrical recess to fit with this attaching portion 1c, and cutouts 141 to fit with the pyramid-shaped projections 140. A suction opening 112 is formed in the recess of coupling 110. FIG. 20A is a sectional view showing a brush 1 supported in the coupling 110. FIG. 20B is a view of the coupling 110 seen from below. FIG. 20C is a view of the brush 1 seen from above.

Figures 20D, 20E, 20F:
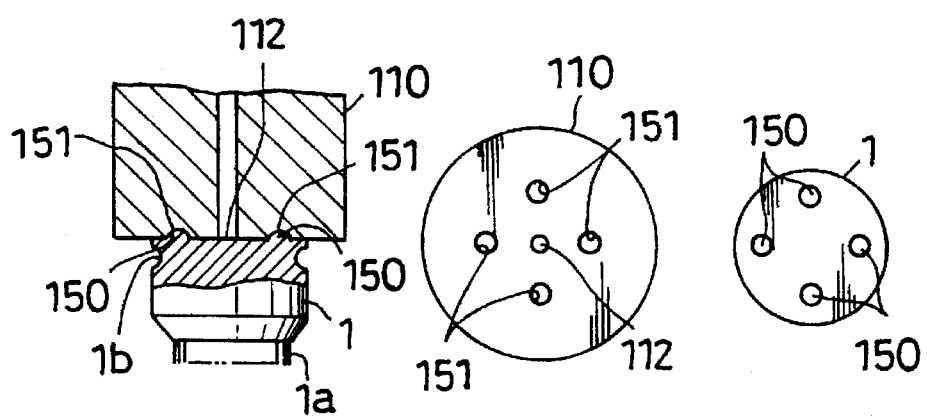

In the construction shown in FIGS. 20D through 20F, the attaching portion 1c defines a plurality of (four in the drawings) projections 150. The coupling 110 defines a plurality of recesses 151 to fit with the projections 150 of attaching portion 1c, with a suction opening 112 formed in a lower surface of coupling 110. FIG. 20D is a sectional view showing a brush 1 supported in the coupling 110. FIG. 20E is a view of the coupling 110 seen from below. FIG. 20F is a view of the brush 1 seen from above.

Figures 20G, 20H, 20I:
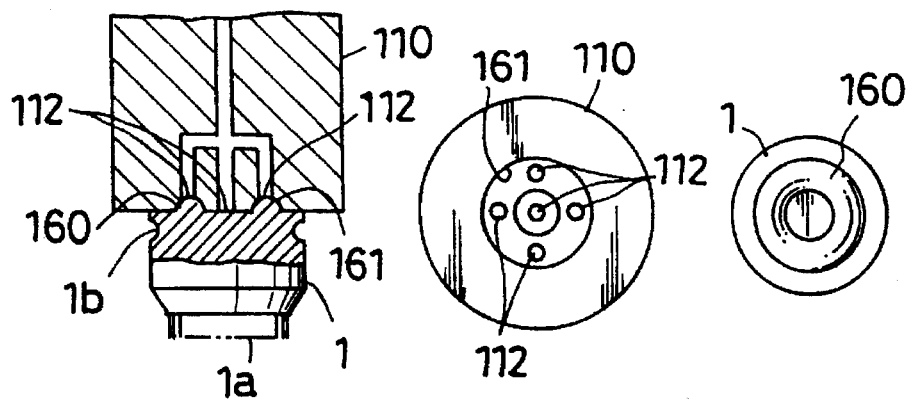

In the construction shown in FIGS. 20G through 20I, the attaching portion 1c defines an annular projection 160, while the coupling 110 defines an annular recess 161 to fit with the projection 160 of attaching portion 1c, with suction openings 112 formed in a lower surface of coupling 110 and in the recess 161. FIG. 20G is a sectional view showing a brush 1 supported in the coupling 110. FIG. 20H is a view of the coupling 110 seen from below. FIG. 20I is a view of the brush 1 seen from above.

FIGS. 20A through 20I show only examples of constructions of attaching portion 1c and coupling 110 and the position of suction opening or openings 112. The constructions of attaching portion 1c and coupling 110 and the position of suction opening or openings 112 are variable in many other ways.

Figure 17:
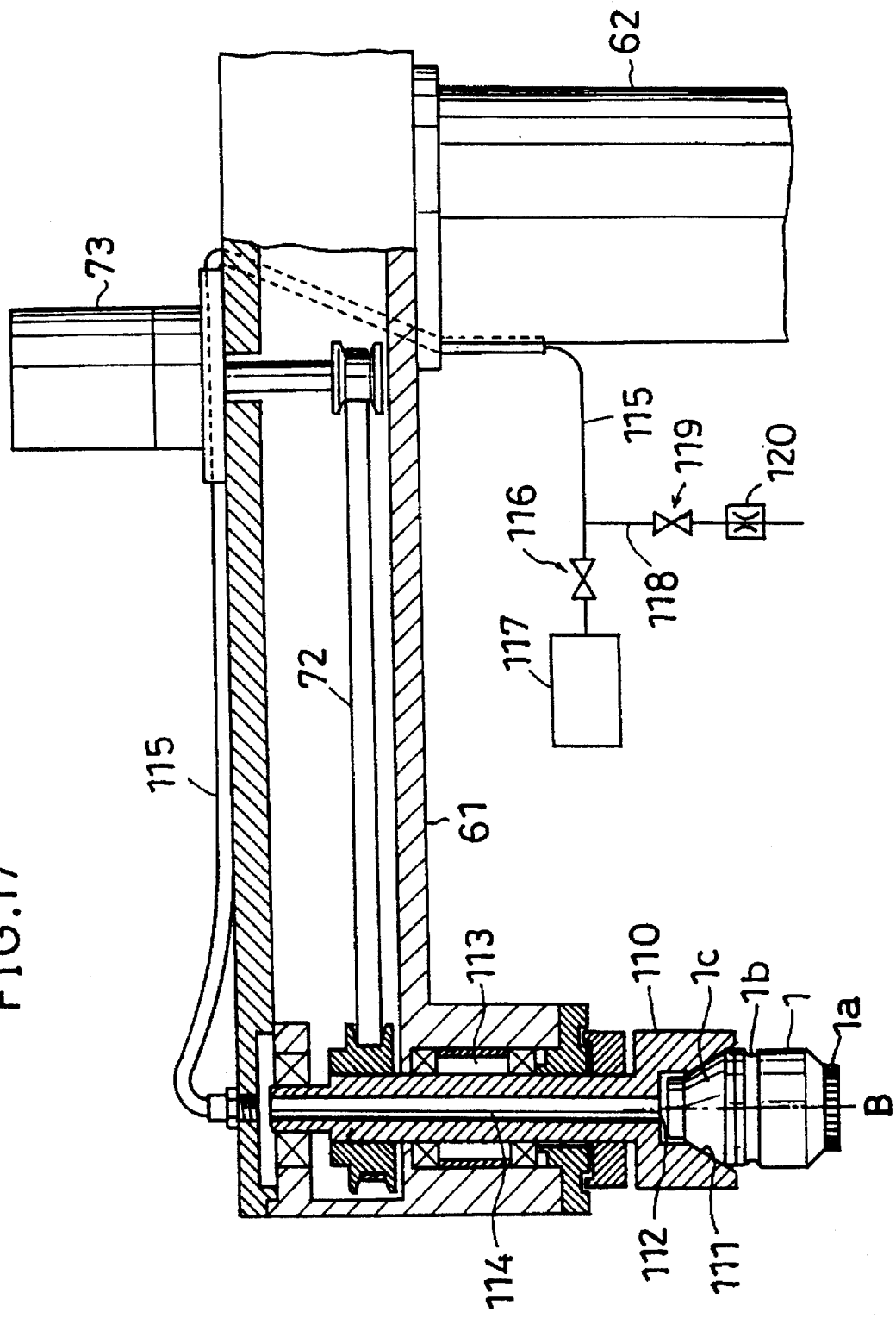
FIG. 17 is a side view, partly in section, showing a principal portion of a modification relating to a connection between an arm and a brush in the fourth embodiment.

In the first to third embodiments, the brushes 1 are connected to the brush arms 2 beforehand. The brushes 1 need to be changed when worn out. The connection between brush 1 and brush arm 2 is provided by meshing of a bolt and a nut as described in relation to the prior art. When a brush 1 is changed in the first to third embodiments, particles could be produced from an abrasion between the bolt and nut to contaminate substrates as in the prior art. Thus, the connection between brush 1 and brush arm 2 may be effected by vacuum suction as described with reference to FIGS. 17 through 19 and FIGS. 20A through 20I. The use of vacuum suction avoids generation and scattering of particles to contaminate substrates. In this case, each brush arm 2 may be constructed as shown in FIG. 17, with suction piping or the like provided in the brush arm 2.

In this case, a brush 1 is attached and detached as follows.

For attaching the brush 1, the operator fits the tapered attaching portion 1c of brush 1 into the tapered recess 111 in the coupling 110 of brush arm 2. In this state, the switch valve 116 is opened and the switch valve 119 closed to establish a state of decompression by the vacuum source 117. As a result, the brush 1 is sucked to the coupling 110 of brush arm 2.

For detaching the brush 1, the switch valve 116 is closed to cancel the suction through the suction opening 112, or the switch valve 116 is left open and the switch valve 119 is opened to decrease the suction (this decrease being adjusted by the needle valve 120) through the suction opening 112. Then, the operator removes the attaching portion 1c of brush 1 from the recess 111 in the coupling 110 of brush arm 2. When detaching the brush 1, the switch valve 119 may be opened with the switch valve 116 left open, to decrease the vacuum suction through the suction opening 112. Then, particles, if any, are drawn through the suction opening 112, thereby avoiding scattering of the particles.

The present invention may be embodied in other specific forms without departing from the spirit or essential attributes thereof and, accordingly, reference should be made to the appended claims, rather than to the foregoing specification, as indicating the scope of the invention.

What is claimed is:

1. A cleaning apparatus for cleaning a surface of a substrate with a brush while spinning the substrate, said apparatus comprising:

a plurality of brushes standing by in a standby position outside an outer edge of said substrate; and moving means for selecting one of said brushes, and moving said one of said brushes between said standby position and said surface of said substrate.

2. A cleaning apparatus as defined in claim 1, further comprising vertical shift means for vertically shifting said one of said brushes.

3. A cleaning apparatus as defined in claim 1, further comprising brush rotating means for rotating said one of said brushes while said moving means moves from a central position of said surface toward said outer edge of said substrate.

4. A cleaning apparatus as defined in claim 1, further comprising:

a standby pot disposed in said standby position for receiving at least lower end portions of said brushes that are standing by in said standby pot;

standby brush rotating means for rotating said brushes that are standing by in said standby pot; and cleaning liquid spray means for spraying a cleaning liquid to said lower end portions that are disposed in said standby pot.

5. A cleaning apparatus as defined in claim 1, further comprising a plurality of brush support arms standing by in juxtaposition in said standby position and having said brushes connected to distal ends thereof, respectively, a selected one of said brush support arms being swung about a fixed pivotal point to move said one of said brushes connected thereto between said standby position and said surface of said substrate.

6. A cleaning apparatus as defined in claim 5, wherein said brush support arms are of one length, said apparatus further comprising a swing arm pivotable about said fixed pivotal point, engaging means for connecting said swing arm to said selected one of said brush support arms, horizontal movement means for moving said brush support arms horizontally in directions of juxtaposition thereof to allow said selected one of said brush support arms to be connected to said swing arm, lift means for vertically moving said swing arm and said selected one of said brush support arms connected to said swing arm, and swing drive means for swinging said swing arm and said selected one of said brush support arms about said fixed pivotal point, whereby said selected one of said brush support arms is swung about said fixed pivotal point to move said one of said brushes connected thereto between said standby position and said surface of said substrate.

7. A cleaning apparatus as defined in claim 5, wherein said brush support arms have progressively longer lengths away from said substrate, said apparatus further comprising a swing arm pivotable about varied pivotal points assigned to said brush support arms, respectively, engaging means for connecting said swing arm to said selected one of said brush support arms, traversing means for moving said swing arm transversely of said brush support arms to allow said selected one of said brush support arms to be connected to said swing arm, lift means for vertically moving said swing arm and said selected one of said brush support arms connected to said swing arm, and swing drive means for swinging said swing arm and said selected one of said brush support arms about one of said pivotal points assigned to said selected one of said brush support arms, whereby said selected one of said brush support arms is swung about said fixed pivotal point to move said one of said brushes connected thereto between said standby position and said surface of said substrate.

8. A cleaning apparatus as defined in claim 5, wherein each of said brush support arms has a suction opening formed in the distal end thereof and communicating with a vacuum source, each of said brushes being connected to said distal end of each of said brush support arms by vacuum suction.

9. A cleaning apparatus as defined in claim 8, wherein each of said brushes includes a tapered attaching portion connected to the distal end of each of said brush support arms, and each of said brush support arms includes a tapered recess formed in the distal end thereof to fit with said attaching portion, and a suction opening formed in said recess, each of said brushes being connected by vacuum suction to said distal end of each of said brush support arms, with said attaching portion fitted in said recess.

10. A cleaning apparatus as defined in claim 1, wherein only said brushes stand by in said standby position, said moving means comprising a single swing arm that is connectible at its distal end to said brushes one at a time as each of said brushes is selected for connection to said swing arm, said swing arm being swung about a predetermined pivotal point to move a selected one of said brushes between said standby position and said surface of said substrate.

11. A brush cleaning apparatus as defined in claim 10, wherein said swing arm has a suction opening formed in the distal end thereof and communicating with a vacuum source, each of said brushes being connected to said distal end of said swing arm one at a time by vacuum suction.

12. A cleaning apparatus as defined in claim 11, wherein each of said brushes includes a tapered attaching portion connected to the distal end of said swing arm, and said swing arm includes a tapered recess formed in the distal end thereof to fit with said attaching portion, and a suction opening formed in said recess, each of said brushes being connected by vacuum suction to said distal end of said swing arm one at a time, with said attaching portion fitted in said recess.

* * * * *